US012309535B2

(12) United States Patent
Ha et al.

(10) Patent No.: US 12,309,535 B2
(45) Date of Patent: May 20, 2025

(54) PROJECTION DEVICE FOR DISPLAYING CONSTRUCTION PLANS

(71) Applicants: Hieu Thuan Charles Ha, Montreal (CA); Mehran Narouei, Montreal (CA); Jonathan Lefebvre, Montreal (CA)

(72) Inventors: Hieu Thuan Charles Ha, Montreal (CA); Mehran Narouei, Montreal (CA); Jonathan Lefebvre, Montreal (CA)

(73) Assignee: 9373-6817 QUEBEC INC., Montreal (CA)

( * ) Notice: Subject to any disclaimer, the term of this patent is extended or adjusted under 35 U.S.C. 154(b) by 374 days.

(21) Appl. No.: 17/298,338

(22) PCT Filed: Nov. 29, 2019

(86) PCT No.: PCT/CA2019/051711
§ 371 (c)(1),
(2) Date: May 28, 2021

(87) PCT Pub. No.: WO2020/107123
PCT Pub. Date: Jun. 4, 2020

(65) Prior Publication Data

US 2022/0103794 A1    Mar. 31, 2022

Related U.S. Application Data

(60) Provisional application No. 62/772,917, filed on Nov. 29, 2018.

(51) Int. Cl.
*H04N 9/31*        (2006.01)
*G01S 17/89*       (2020.01)
(Continued)

(52) U.S. Cl.
CPC .......... *H04N 9/3194* (2013.01); *G01S 17/89* (2013.01); *G02B 26/105* (2013.01); *G06F 30/13* (2020.01);
(Continued)

(58) Field of Classification Search
None
See application file for complete search history.

(56) References Cited

U.S. PATENT DOCUMENTS 6,384,823 B1    5/2002   Donoghue
6,935,748 B2    8/2005   Kaufman et al.
(Continued)

FOREIGN PATENT DOCUMENTS

DE    102013205633 A1    10/2013
EP         0895577 A2     2/1999
(Continued)

OTHER PUBLICATIONS

Extended European Search Report issued in corresponding European application No. 19891397.2 on Jun. 22, 2022.
(Continued)

*Primary Examiner* — Stuart D Bennett
(74) *Attorney, Agent, or Firm* — BCF LLP

(57) ABSTRACT

A projection device for displaying construction plans comprises a projector head having projection optics, a laser module, a first minor galvanometer redirecting incident light from the laser module toward a second minor galvanometer that redirects further the incident light toward the projection optics. A memory device stores one or more construction plans. A controller operatively connected to the laser module, the two minor galvanometers, and the memory device chooses a construction plan to be displayed from the memory device, selectively activates the laser module, and selectively causes the first and second mirror galvanometers
(Continued)

to follow a path defined by the chosen construction plan concurrently with the selective activation of the laser module so that the incident light redirected toward the projection optics selectively forms a projection of the construction plan on a construction site.

17 Claims, 14 Drawing Sheets

(51) Int. Cl.
    G02B 26/10    (2006.01)
    G06F 30/13    (2020.01)
(52) U.S. Cl.
    CPC ......... *H04N 9/3129* (2013.01); *H04N 9/3161* (2013.01); *H04N 9/3185* (2013.01)

(56) References Cited

U.S. PATENT DOCUMENTS

| | | |
|---|---|---|
| 8,904,657 B1 | 12/2014 | Kittrell |
| 9,121,692 B2 | 9/2015 | Kahle et al. |
| 10,317,184 B1 | 6/2019 | Keller |
| 2005/0035943 A1 | 2/2005 | Kojima |
| 2005/0117132 A1 | 6/2005 | Agostinelli |
| 2006/0016891 A1* | 1/2006 | Giebel ............... G06K 7/10584 235/462.25 |
| 2007/0001111 A1 | 1/2007 | Rueb et al. |
| 2008/0055554 A1* | 3/2008 | Tubin ..................... G03B 21/26 353/30 |
| 2008/0246943 A1* | 10/2008 | Kaufman ........... G01N 21/9515 356/5.01 |
| 2009/0005961 A1* | 1/2009 | Grabowski ............ G02B 27/01 701/532 |
| 2009/0147272 A1* | 6/2009 | Gibson ................ H04N 9/3155 353/122 |
| 2010/0318319 A1* | 12/2010 | Maierhofer ............. G01S 17/89 702/150 |
| 2011/0314684 A1 | 12/2011 | Hayes et al. |
| 2012/0057174 A1 | 3/2012 | Briggs |
| 2015/0071524 A1 | 2/2015 | Han et al. |
| 2016/0018258 A1* | 1/2016 | Goldsmith ........... H04N 9/3129 356/121 |
| 2016/0057400 A1 | 2/2016 | Winter et al. |
| 2017/0280114 A1 | 9/2017 | Samuelson et al. |
| 2017/0329211 A1 | 11/2017 | Chien |
| 2018/0088214 A1* | 3/2018 | O'Keeffe ............. G01S 7/4815 |
| 2018/0219349 A1* | 8/2018 | Lemire ..................... F41J 5/00 |
| 2019/0259210 A1 | 8/2019 | Ghaleb |

FOREIGN PATENT DOCUMENTS

| | | |
|---|---|---|
| EP | 1277066 B1 | 11/2008 |
| EP | 2277082 A1 | 1/2011 |
| EP | 3142358 A1 | 3/2017 |
| EP | 3382337 A1 | 10/2018 |
| JP | H08-226819 A | 9/1996 |
| JP | 2004-116198 A | 4/2004 |
| JP | 2005-121386 A | 5/2005 |
| JP | 2005-275327 A | 10/2005 |
| JP | 2007187755 A | 7/2007 |
| JP | 2008-224516 A | 9/2007 |
| JP | 2010-044204 A | 2/2010 |
| JP | 2010-107545 A | 5/2010 |
| JP | 2011-158371 A | 8/2011 |
| JP | 2012-044103 A | 3/2012 |
| JP | 2013-215880 A | 10/2013 |
| JP | 2013-539541 A | 10/2013 |
| JP | 2013-540984 A | 11/2013 |
| JP | 2016-151113 A | 8/2016 |
| JP | 2017-058141 A | 3/2017 |
| JP | 2017-165562 A | 9/2017 |
| JP | 2017-218792 A | 12/2017 |
| JP | 2018-185253 A | 11/2018 |
| KR | 101496761 B1 | 2/2015 |
| WO | 2018229769 A1 | 12/2018 |
| WO | 2021033185 A2 | 8/2020 |
| WO | 2021044422 A1 | 3/2021 |

OTHER PUBLICATIONS

Park, Y.J. et al., "DesignAR: Portable projection-based AR system specialized in interior design", IEEE International Conference on Systems, Man, and Cybernetics (SMC), pp. 2879-2884, 2017.

Kirchbach, K. et al., "Optimized work flow through VR and AR technology on construction sites", 15th Internaitonal Conference on Information Visualisation, London, pp. 549-551, 2011.

International Search Report and Written Opinion issued in corresponding International application No. PCT/CA2019/051711 on Mar. 3, 2020.

Hilti Inc., Layout system PLT 300, Advanced layout simplified, Feb. 3, 2016.

English Translation of the First Office Action issued from the Japanese Patent Office during the prosecution of corresponding application JP 2021-531382 issued on Jul. 4, 2023.

Office Action issued from the European Patent Office during the prosecution of corresponding application 19891397.2 issued on Mar. 13, 2024.

\* cited by examiner

PROJECTION DEVICE FOR DISPLAYING CONSTRUCTION PLANS

CROSS-REFERENCE

The present application claims priority to U.S. Provisional Patent Application No. 62/772,917, filed on Nov. 29, 2018, the entirety of which is incorporated herein by reference.

TECHNICAL FIELD

The present disclosure relates to the field of projection devices. More specifically, the present disclosure relates to a projection device for displaying construction plans.

BACKGROUND

During construction and renovation, construction plans are made to describe the work to be done. Generally, the most used method to draw the layout of the construction plans on a construction site is to manually draw the construction plans on the surrounding areas with a tape measure with a chalk line or a pen.

This solution can be inaccurate and slow. Often, this work can also only be done by skilled workers. Both the time taken and the experience needed can increase costs of the construction job. Additionally, reality and construction plans have differences that may not be noticed until the layout has been drawn. In some cases, this could require the construction plans and/or the entire drawing work to be redone.

Some alternative solutions for presenting construction plans have been proposed. For example, in some solutions, a worker can produce a physical drawing as above, but aided by projection of points to represent specific reference points (a corner of a wall or other). The setup and installation of such solutions can be complex, however, and may be unsuited for unskilled workers or operators.

Therefore, there is a need for improvements for presenting construction plans that compensate for problems related to inaccuracies, wasted time and wasted efforts on construction sites.

SUMMARY

According to the present disclosure, there is provided a projection device for displaying construction plans. The projection device comprises a projector head, a memory device and a controller. The projector head comprises a set of projection optics, a laser module, and two mirror galvanometers, including a first mirror galvanometer configured to redirect incident light from the laser module toward a second mirror galvanometer, the second mirror galvanometer being configured to redirect the incident light from the first mirror galvanometer toward the set of projection optics. The memory device stores one or more construction plans. The controller is operatively connected to the laser module, the two mirror galvanometers, and the memory device. The controller chooses a construction plan to be displayed from the memory device, selectively activates the laser module, and selectively causes the first and second mirror galvanometers to follow a path defined by the chosen construction plan concurrently with the selective activation of the laser module so that the incident light redirected toward the projection optics selectively forms a projection of the construction plan on a construction site.

According to the present disclosure, there is also provided a projection device for displaying construction plans. The projection device comprises a projector head, a memory device and a controller. The projector head comprises a set of projection optics, a laser module, a galvanometric system adapted to direct incident light from the laser module toward the set of projection optics, a yaw encoder adapted to detect in real-time a yaw of the projector head, and a pitch encoder adapted to detect in real-time a pitch of the projector head. The memory device stores one or more construction plans. The controller is operatively connected to the laser module, the galvanometric system, the yaw encoder, the pitch encoder, and the memory device. The controller chooses a construction plan to be displayed from the memory device, selectively activates the laser module, and selectively causes the galvanometric system to follow a path defined by the chosen construction plan concurrently with the selective activation of the laser module so that the incident light directed toward the projection optics selectively forms a projection of the construction plan on a construction site, the projection of the construction plan being adapted in real-time according to changes in the yaw, the pitch, or both the yaw and the pitch of the projector head.

The present disclosure further relates to a projection device for displaying construction plans. The projection device comprises a projector head, a memory device, a controller and a laser safety module. The projector head comprises a set of projection optics, a laser module, and a galvanometric system adapted to direct incident light from the laser module toward the set of projection optics. The memory device stores one or more construction plans. The controller is operatively connected to the laser module, the two mirror galvanometers, and the memory device. The controller chooses a construction plan to be displayed from the memory device, selectively activates the laser module, and selectively causes the first and second mirror galvanometers to follow a path defined by the chosen construction plan concurrently with the selective activation of the laser module so that the incident light redirected toward the projection optics selectively forms a projection of the construction plan on a construction site. The laser safety module is operatively connected to the laser module and is adapted for dynamically controlling an operation of the laser module.

According to the present disclosure, there is also provided a method of operation of the projection device. The projection device is positioned on a construction site. A construction plan is loaded in the projection device. The projection of the construction plan on the construction site is then initiated.

The foregoing and other features will become more apparent upon reading of the following non-restrictive description of illustrative embodiments thereof, given by way of example only with reference to the accompanying drawings.

BRIEF DESCRIPTION OF THE DRAWINGS

Embodiments of the disclosure will be described by way of example only with reference to the accompanying drawings, in which.

Like numerals represent like features on the various drawings. It should be noted that the Figures are not necessarily drawn to scale.

DETAILED DESCRIPTION

Figure 1:
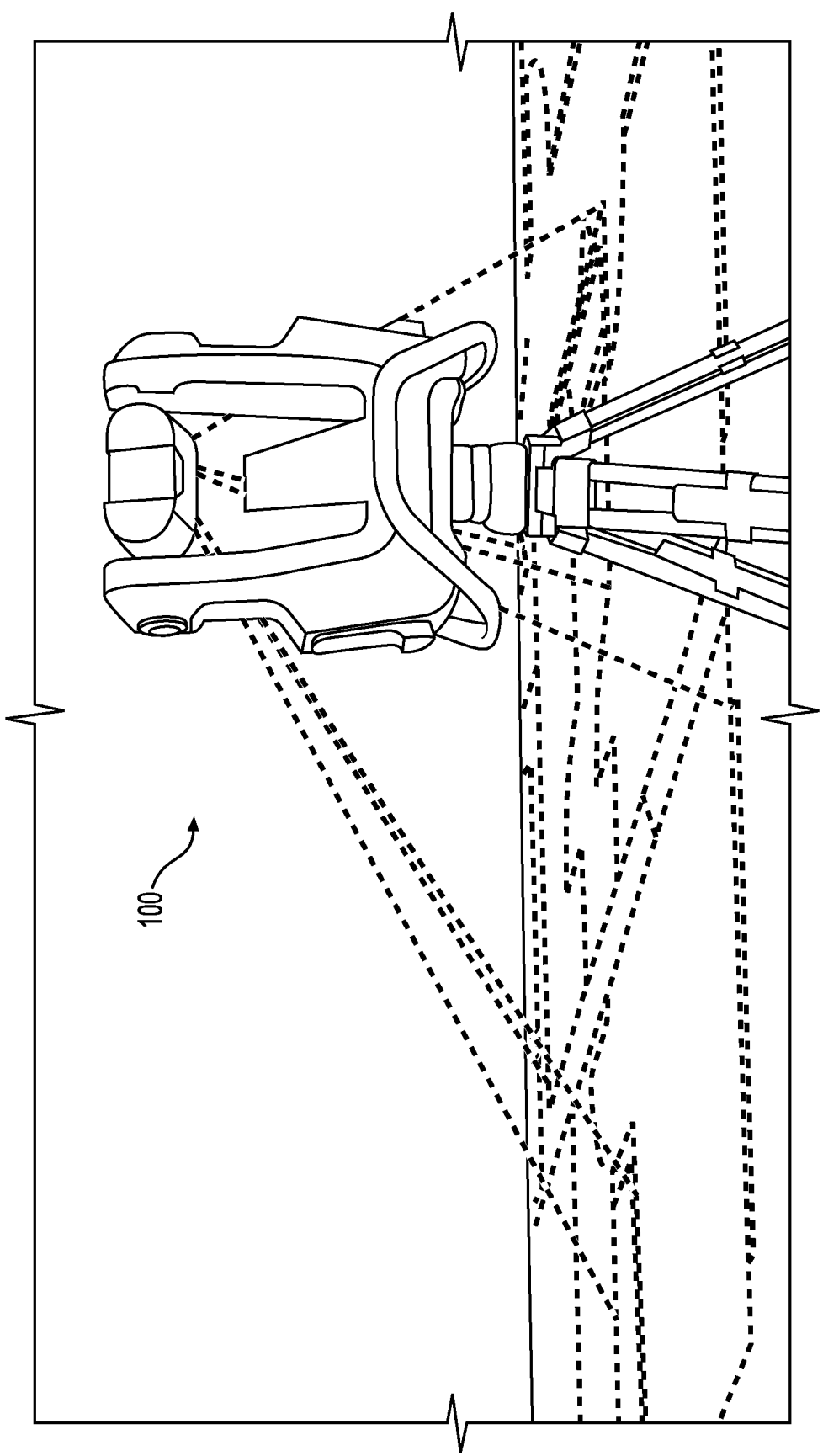
FIG. 1 is a illustrative view of a projection device, shown in use, according to an embodiment of the present technology.

Various aspects of the present disclosure generally address one or more of the problems related to inaccuracies, wasted time and wasted efforts on construction sites.

The present disclosure introduces a projection device that determines its position on a construction site with respect to known reference points on a construction site and, accordingly, project parts or all the whole of a building plan, a floor plan, a construction layout, and the like (generally referred to as a "construction plan"), depending on its spatial position (for example along an axis x and an axis y perpendicular to the axis x) and angular positions (i.e. orientation in terms of pitch and yaw) of a projector head. The reference points may be installed by an operator of the projection device on a local area where the projection device is put to use. It is contemplated that the reference points could be elements already present in the local area, for example marks placed on the floor by a professional surveyor or entities on the construction site, such as wall corners. Alternatively, an operator of the projection device or an assistant may install reference points on the construction site when setting up the projection device. Three or more reference points may be used to assist the positioning of the projection device. It is also contemplated that positioning information for the projection device on the construction site may be manually entered, the positioning information being defined by means external to the projection device.

The projection device is controlled either manually by hand by an operator, or by human machine interface (HMI) that is connected to the projection device by a wired or a wireless connection. The HMI may for example comprise a built-in interactive screen or an application running on a computer or any generic controller. The projection device is able to rotate 360 degrees on two axes including a vertical axis and a horizontal axis, and use laser projection to project pertinent information on surrounding surfaces, including floors, walls and ceilings. The projection device may be powered by use of one or more batteries and be capable of supporting a hot swap of the batteries to maintain an uninterrupted projection when changing a battery or Alternatively, the projection device may be powered through a cable connected into a wall outlet. Some embodiments of the projection device may be equipped with precise sensors adapted to detect movements brought to the projection device. The projection device may adapt its projection according to such detected movements, therefore eliminating the need to recalibrate the projection each time the projection device is moved. The operator may use the HMI to modify the construction plan to be projected and add, delete or, move around image entities, for example walls, holes, doors, columns, and the like, if desired and depending on the embodiment. After the entities have been added, deleted, or moved, the projection device adapts the projection to reflect these changes. As such, the projection device allows the operator to reconcile differences between the construction plan and the reality of the construction site, adapting the construction plan as desired.

An embodiment of a projection device 100 according to the present technology will now be described with reference to FIGS. 1 to 3. The projection device 100 receives construction plans from an external source and, based on these construction plans, defines guide lines that are projected onto surroundings on a construction site. The projected guide lines are instrumental in aiding construction workers in positioning various elements such as walls, doors, kitchen cupboard, and the like. The projection device 100 aids in reducing the workload and increasing the productivity of the construction workers by replacing the task of physically drawing out the construction plans' layout on the construction site. The workers are able to see any differences that may occur between reality and the construction plan before any actual construction work is done. Construction plan corrections may therefore be prepared and entered in the projection device 100 before any construction work is done and wasted. An operator of the projection device 100 and other construction workers may decide to draw on surfaces of the construction site, over the projection before starting work. Alternatively, the construction workers may decide to work directly over the laser projection. Some embodiments of the projection device 100 may be able to recognize and track objects moving on the construction site, automatically aim at reference points, measure distances between objects and/or between reference points, generate a three-dimensional (3D) virtual environment map that may be used for multiple purposes, for example to measure or evaluate flatness of surfaces using techniques described hereinbelow, or use the generated 3D virtual environment map as reference. Prism reflectors or custom-made targets having reflective surfaces may be disposed on the reference points to improve the accuracy of detection of the reference points. Features of the custom-made targets may support computer vision tracking features implemented in the projection device 100.

Figure 2:
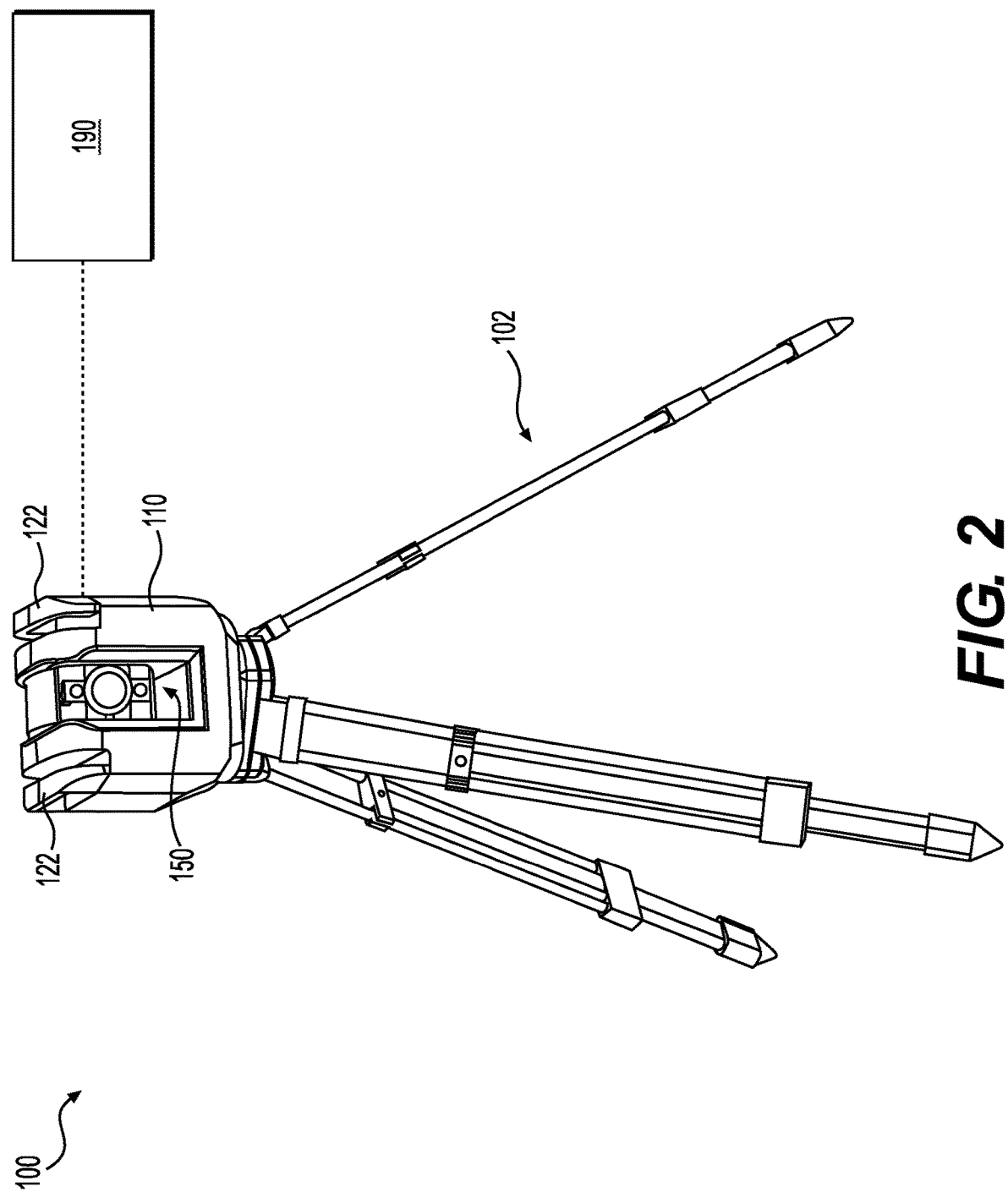
FIG. 2 is a front perspective view of the projection device of FIG. 1 according to an embodiment of the present technology.
Figure 3:
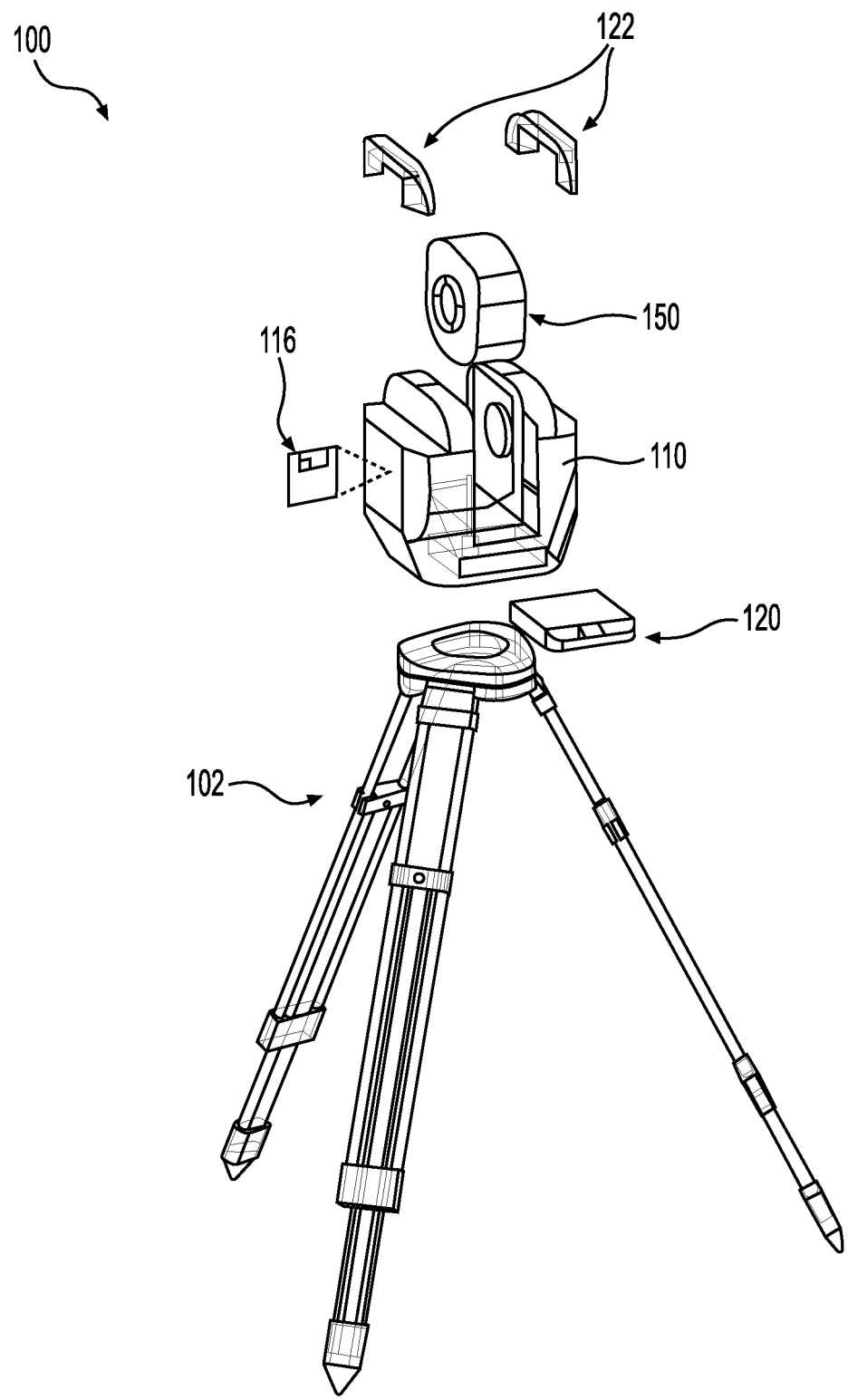
FIG. 3 is an exploded, rear perspective view of the projection device of FIG. 1 according to an embodiment of the present technology.

The embodiment of the projection device 100 shown on FIGS. 2 and 3 includes a casing 110. The casing 110 houses many components of the projection device 100, including mechanical components, optical components, and computational components such as, without limitation, driver boards, microcontrollers, and terminals. The components disposed in the casing 110 will be described in more detail below. The casing 110 contains and protects components of the projection device 100, also described in more detail below.

The projection device 100 includes a tripod 102 for supporting components of the projection device 100. The casing 110 is selectively fastened to the tripod 102. It is contemplated that the casing 110 could be supported by a different support structure. It is also contemplated that the casing 110 could be provided without any additional structure and could be placed on a surface in the area of operations.

The casing 110 receives a battery pack 120 to power the projection device 100. The battery pack 120 includes a plurality of battery cells, but it is contemplated that different battery constructions could be used. It is also contemplated that the projection device 100 could be powered by different power sources than the battery pack 120, for example by use of an electrical cord pluggable to a wall outlet.

The casing 110 also houses controller disposed therein. The controller may be implemented as a generic processor or as a group of generic processors, operatively connected to a memory device or to a group of memory devices and to one or more interfaces allowing the controller to communicate with other components of the casing 110. In an embodiment, the controller is implemented as a System on Chip (SoC) 116, for example a Jetson TX2 by NVidia or a NUC by Intel. The SoC 116 is a computer device designed for and compressed to fit on a single board. The SoC 116 responsible for making most of the calculations and decisions for the projection device 100. Without limitation, software running on the SoC 116 may have been written in C++ with an object-oriented architecture, or in JavaScript using a cross-platform runtime environment node.js. The SoC 116 is communicatively connected to and receives input from other components of the projection device 100 and delivers appropriate outputs. The calculations performed by the SoC 116 may comprise the translation of construction plans, entered by the operator, into angles of projection (described in more detail below). The SoC 116 may be equipped with a graphical processing unit (GPU), not separately illustrated, for 3D Processing and for interacting with a human machine interface (HMI) 190. The SoC 116 may be operatively connected to a wireless communication hardware contained in the casing 110. Through the wireless communication hardware, the projection device 100 may automatically update its firmware and download construction plans from secure remote servers. This also aids in monitoring of the projection device 100, and it may help remote troubleshooting of any eventual hardware or software problems of the projection device 100.

The HMI 190 allows a human operator to control the projection device 100. In an embodiment, the HMI 190 may be a tablet running an iOS or an Android operating system and communicatively connected to the SoC 116 via wireless connection. It is contemplated that the HMI 190 could be connected to the SoC 116 via a hardwired connection in some embodiments. It is also contemplated that the HMI 190 could be of a different form, including but not limited to: an operator's personal phone, an application running from a computer, an interactive screen built into the projection device 100, and a custom controller similar to a gamepad. It is further contemplated that the HMI 190 could be integrated in the projection device 100, for example as a liquid crystal display (LCD) screen.

The casing 110 includes two ergonomically designed handles 122 fastened to the casing 110. The handles 122 are provided for convenient carrying of the projection device 100. It is contemplated that the handles 122 could be omitted in some embodiments.

The casing 110 also houses a projector head 150. The casing 110 also houses a rotational motor 140 (see FIG. 4). The motor 140 is operatively connected to the projector head 150 to control and determine a vertical angular position (pitch) of the projector head 150.

Figure 4:
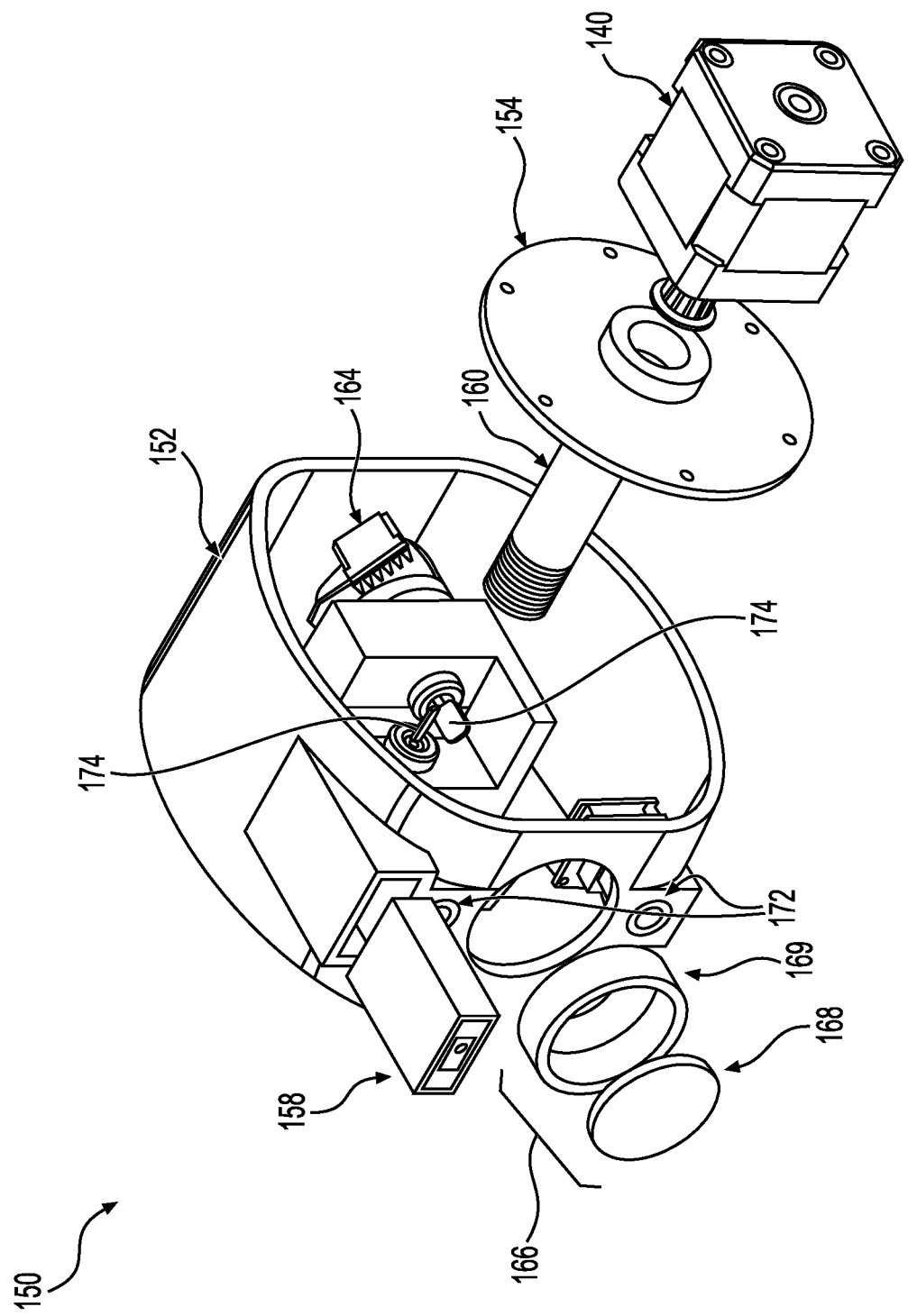
FIG. 4 is an exploded view of a projector head of the projection device of FIG. 1 according to an embodiment of the present technology.

With reference to FIG. 4, components of the projector head 150 will now be described. The projector head 150 includes a housing 152 for housing the various components of the projector head 150. Attached to the housing 152 is a mounting apparatus 154 that connects the projector head 150 to the motor 140. The mounting apparatus 154 may be constructed of various different mechanical components.

The projector head 150 includes a rangefinder 158 to measure distances between the projection device 100 and a targeted area on the construction site. The rangefinder 158 may be used to determine the distances between the projection device 100 and the reference points. In an embodiment, the rangefinder 158 may comprise a laser-based rangefinder, although different types of rangefinders could be used in other embodiments. In an embodiment, the rangefinder has a precision of ±1 mm.

The projector head 150 also includes two cameras 172 to generate a 3D map of the environment, detect object, track moving objects, and measure environment luminance of surfaces such as floors, walls and ceilings on the construction site. The SoC 116 may control a power level of the laser module 160 as a function of the measurement luminance so that a brightness of a construction plan projected by the projection device 100 matches the environment luminance. As such, the power level of the laser module 160 may increase in the daytime and decrease during the evening or when the construction site is a generally dark environment. In an embodiment, stereo vision from the two cameras 172 may be used to determine the distances between the projection device 100 and the reference points. In the same or another embodiment, one camera 172 may be used to track moving objects and the other camera may be used to generate the 3D map, and/or measure the luminance of surfaces.

Some embodiments of the projection device 100 are adapted to measure or evaluate flatness of surfaces such as floors, walls and ceilings on the construction site. In one embodiment, the two cameras 172 (and optionally additional cameras) capture images of the floor in a same location on the construction site and the SoC 116 implements a homography calculation based on these images to calculate the flatness and/or elevation of the floor. In another embodiment, the rangefinder 158 takes three or more distance measurements from the projector head 150 to a location on the floor of the construction site, taking notes of angular positions associated to these measurements. The SoC 116 calculates a mean elevation of the floor based on these measurements. In a further embodiment, a LiDAR sensor (not shown) is integrated in the projection device 100. The LiDAR sensor scans the construction site to generate a 3D cloud of points representing the construction site, including the floor. The SoC 116 calculates the flatness and elevation of the floor based on the 3D cloud of points.

The projector head 150 also includes an optical system including a laser module 160, a galvanometric system 164, and a set of projection optics 166. The laser module 160 may for example be a continuous solid-state laser, but it is contemplated that different laser systems could be implemented, including but not limited to pulsed lasers, HeNe lasers, and $CO_2$ lasers. For example and without limitation, the laser module 160 may be a 40 mW laser emitting at a 532 nm wavelength.

The galvanometric system 164, also referred to as a galvo 164, is an electromechanical mechanism including two mirror galvanometers 174 having integrated actuators, for example 6220H devices from Cambridge Technology Inc. The galvanometric system 164 is communicatively connected to the SoC 116 to receive instructions therefrom. The galvanometric system 164 transmits a light beam generated by the laser module 160 and incident thereon to a desired target on the construction site by changing the angles of the mirrors relative to the incident beam angle. In place of the galvanometric metric system 164, the projector head 150 could instead or additionally include acousto-optic, electro-optic scanners, resonant and polygonal scanner. Additionally, the galvanometric system 164 could include more than one set of galvanometers scanners.

The projection optics 166 of the shown embodiment include a lens 168 and an aperture 169. More lenses and optical elements such as filters could be included with the projection optics 166, depending on the specific embodiment. In some embodiments, the projector head 150 could omit lenses, depending on details of the embodiment.

The optical system operates generally as follows. The SoC 116 calculates vector sets representing various points of a construction plan loaded on the projection device 100. Based on these vector sets, the SoC 116 causes the laser module 160 to selectively emit a collimated laser beam onto the galvanometric metric system 164. Also based on these vector sets, the SoC 116 causes the galvanometric metric system 164 to selectively direct the laser beam to variable angles that are controlled according to instructions from the SoC 116, based on the angles of projection defined in the vector sets and calculated on the basis of the construction plan. The thus directed laser beam is then transmitted through and projected by the optics 166. The galvanometric metric system 164 rapidly sweeps the laser beam along the angles that correspond to a visualization to be produced on a surrounding environment for the construction plan. Embodiments of the projection device 100 are adapted to project construction plans up to 10 meters or more from the projection device, with a width of 10 meters or more. The same or other embodiments are capable of maintaining a ±3 mm accuracy of points on the projected construction plans, in an ideal environment when the projection is made on a flat surface. The accuracy of the points on the projected construction plans may be impacted by various irregularities on the construction site and/or by human error. Divergence of laser (edge to edge) is within 12 mm in most situations.

Figure 5:
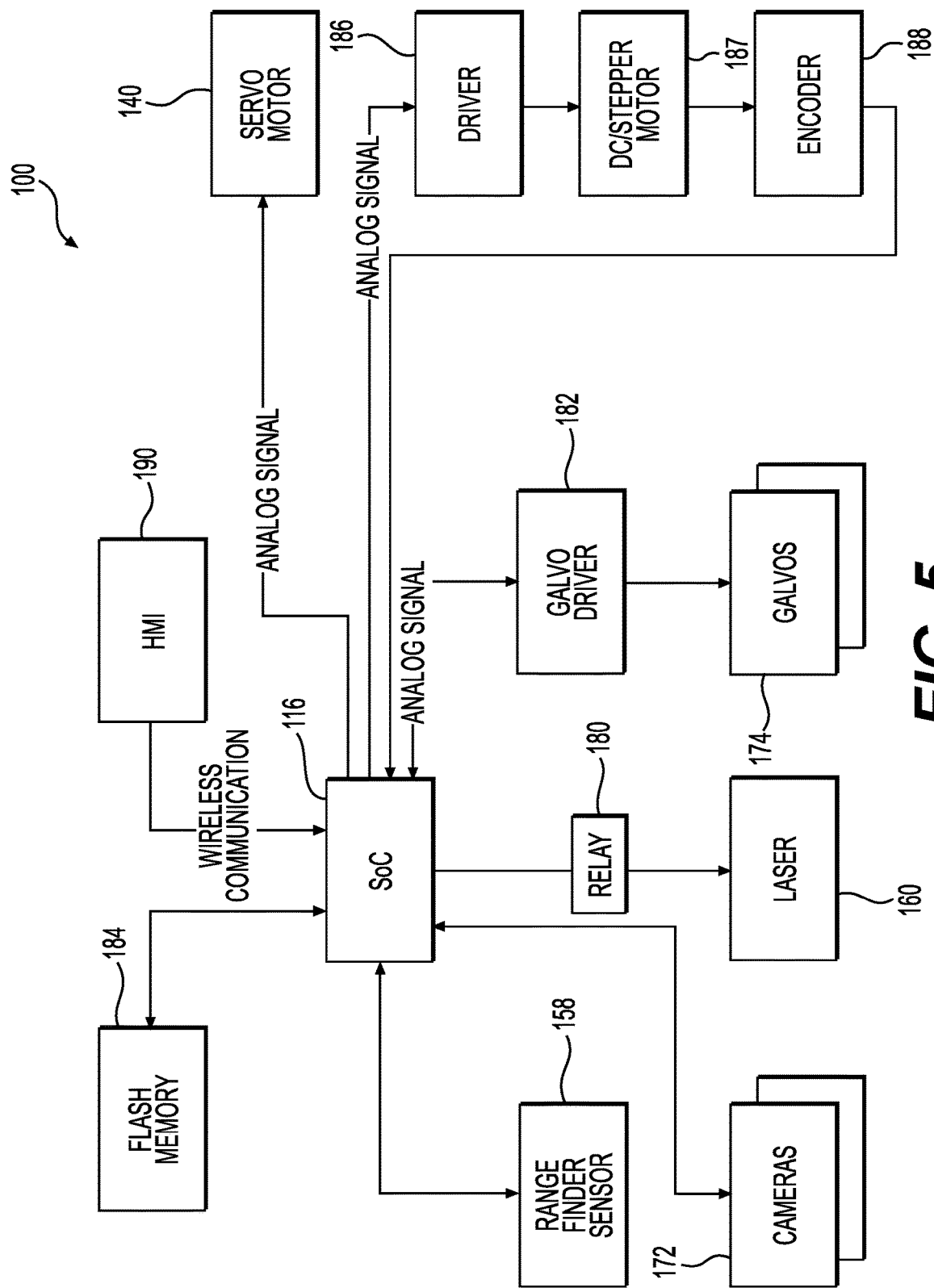
FIG. 5 is a schematic layout of components of the projection device of FIG. 1 according to an embodiment of the present technology.

An overall schematic diagram of the projection device 100, including some of both the mechanical components and computation components, is illustrated in FIG. 5. It should be noted that this is just one non-limiting embodiment and less, additional and/or alternative components could be included in some cases. The embodiment of FIG. 5 shows the projection device 100 including the SoC 116, the laser module 160 connected to the SoC 116 via a relay 180, the rangefinder 158, the cameras 172, a remote controller, for example the HMI 190 being wirelessly connected to the SoC 116, a galvo driver 182 for the galvanometric mirrors 174, a memory device operatively connected to the SoC 116, for example a flash memory 184, the motor 140, which may be a servo motor, the motor 140 being controlled by the SoC 116 to adjust the pitch axis of the projector head 150. For example and without limitation, the galvo driver 182 may be a 673 Series servo driver from Cambridge Technology. A module including a driver 186 connected to a motor 187 (either a DC motor or a stepper motor) is operatively connected to the SoC 116 via analog signals. The encoder 188 provides real-time indications of a yaw axis of the projector head 150 and, in response, the SoC 116 controls the switching circuit 186 and the stepper motor 187 to adjust the yaw axis of the projector head 150. If the pitch or the yaw of the projector head 150 changes over time, the SoC 116 may recalculate in real-time the vector sets to adjust the projection of the construction plan accordingly.

In an embodiment, the projection device 100, specifically the SoC 116 and other computational systems therein, may perform a file conversion. Conventionally, most construction plans are drawn with popular commercial software products such as AutoCAD™, Revit™ or Tekla Structures™. The output file formats of these software products are in standard format such as ".dwg", ".rvt", ".dxf" or ".dwf" files. In this embodiment, the construction plans are first converted into a predetermined, proprietary format (referred to as .msys or .mec file formats in the present disclosure) that may communicate with the projection device 100. This is mainly due to the fact that original construction plans files are full of information elements that are not useful for the operator and would muddle up the image being projected. Example of such information elements may include dimensions that appear on construction plans, their projection being less useful when the construction plan is projected in actual size on the construction site. For this reason, the file is "cleaned up", or simplified, to remove information elements that are considered unimportant by the operator, before its upload onto the projection device 100. This "clean-up" may be automated in an embodiment. In particular, one feature of the projection device 100 may allow the operator to individually select components on the construction plans on a graphical user interface (GUI) of the HMI 190 and move them as the operator wishes, the projection device 100 modifying the projection of the construction plan accordingly. The conversion of the construction plan into the proprietary format facilitates the control over the file structure of the construction plan and thus facilitates changing the construction plan according to the desires of the operator. The conversion of the construction plan into the proprietary format facilitates its manipulation, allowing the operator of the projection device 100 to modify, for example translate, rotate, resize, add or delete elements of the construction plan. Calculations by the SoC 116 of the vector sets that represent the various points of the construction plan and are used to control the laser module 160 and the galvanometric system 164 are also facilitated by this conversion. Cybersecurity is also enhanced by this conversion to the proprietary format. Construction plans are usually trade secrets and properties of our customers. The conversion of the construction plans to the proprietary format by the projection device 100 is useful in preventing unauthorized extraction of the construction plans.

Figure 6:
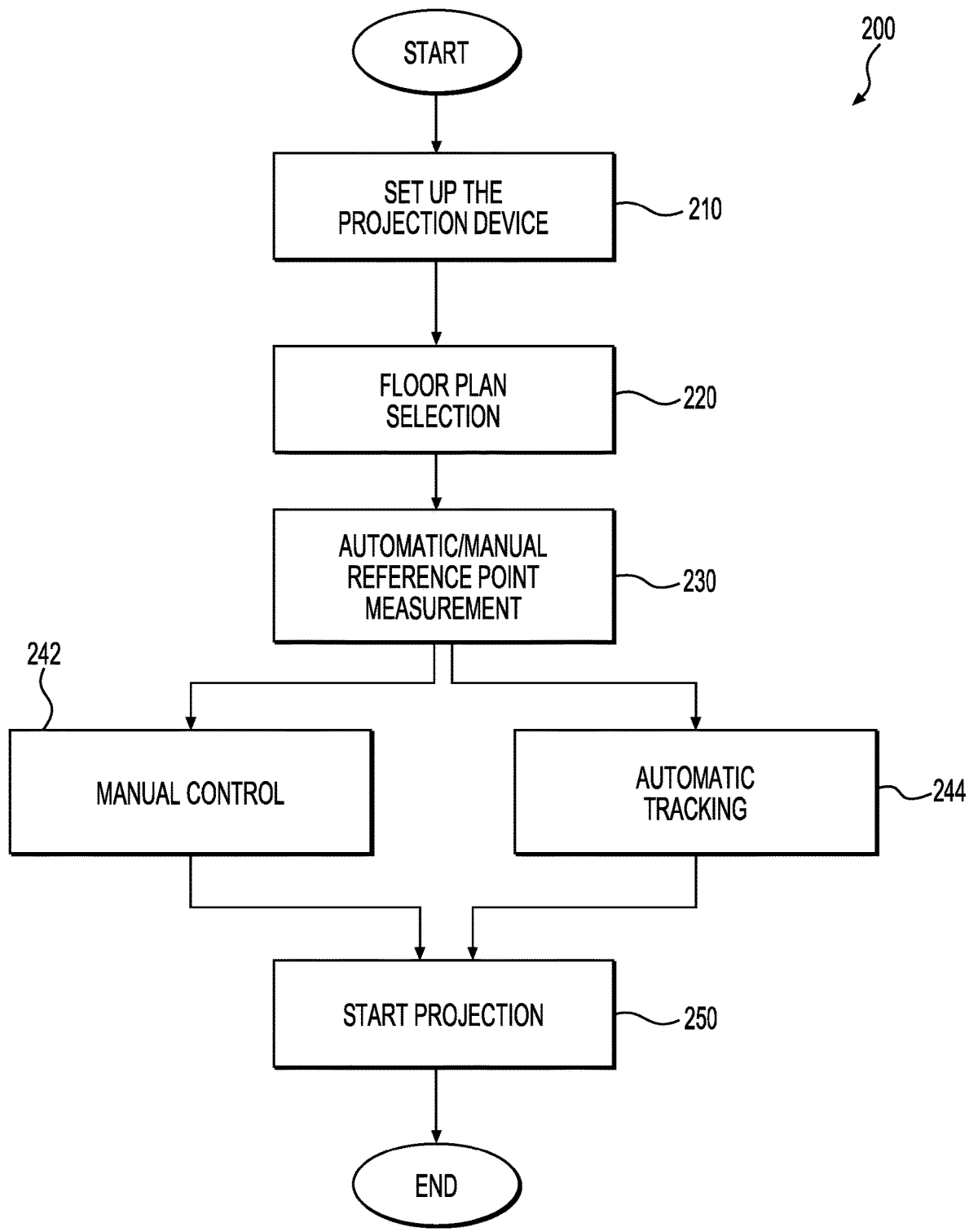
FIG. 6 is a flow chart of a method of operating the projection device of FIG. 1 according to an embodiment of the present technology.
Figure 12:
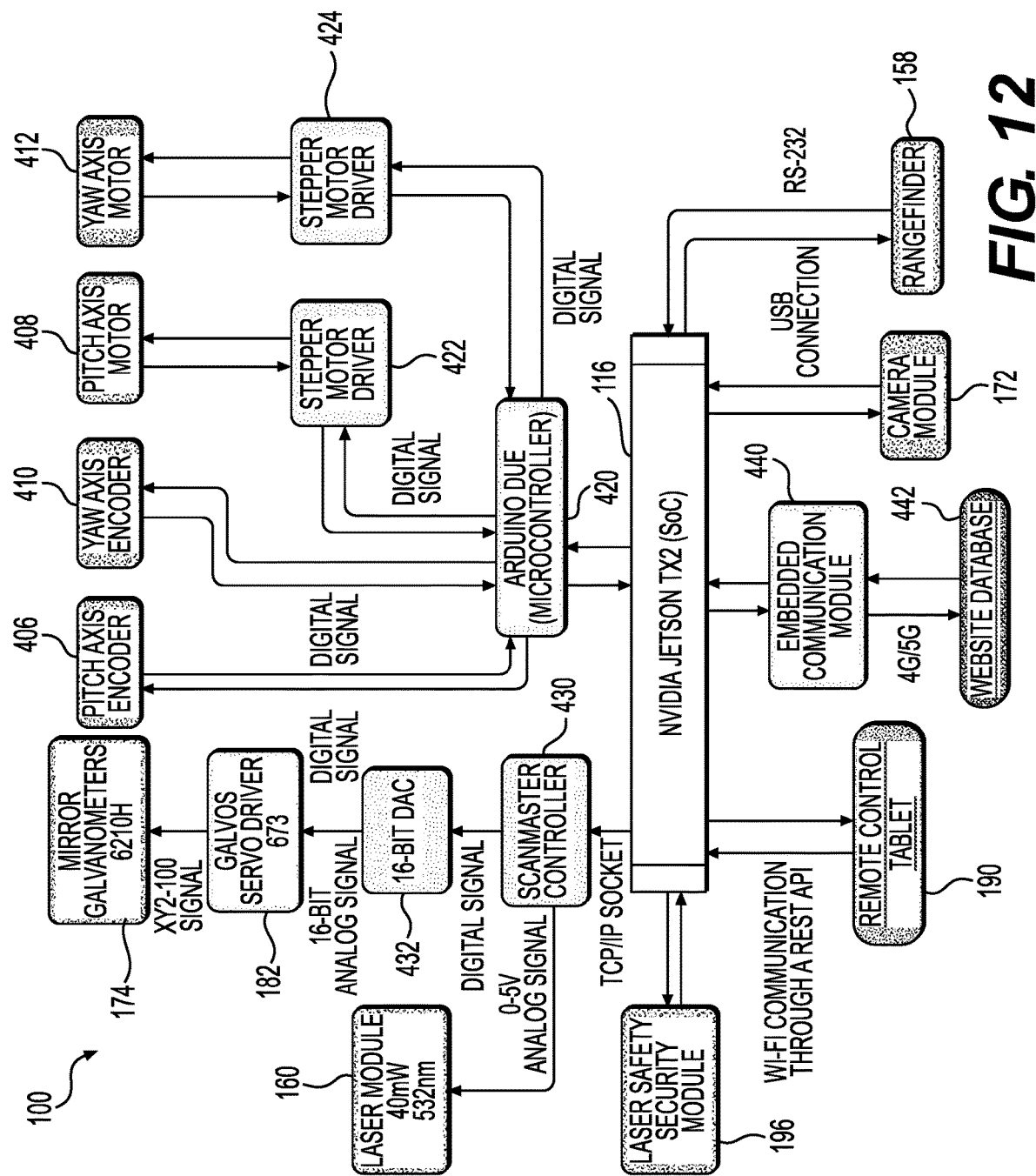
FIG. 12 is a logical view of a hardware architecture of the projection device according to another embodiment of the present technology.

With reference to FIG. 6, a method of operating the projection device 100 will now be described. On FIG. 6, a sequence 200 comprises a plurality of operations, some of which may be executed in variable order, some of the operations possibly being executed concurrently, some of the operations being optional. The sequence 200 begins with setting up the projection device 100 on the construction site at operation 210. The operator unloads components of the projection device 100 from a carrying case. The operator then assembles the projection device 100 by fastening the casing 110 onto the tripod 102. The operator may then level the projection device 100 manually by adjusting the tripod 102. In some embodiments, the operator could also instruct the projection device 100 to automatically level itself via the HMI 190. In these embodiments, encoders (example of which are shown in FIG. 12) may be integrated in the projection device 100 and provide their measurements to the SoC 116. The SoC 116 may use these measurements to command the motors 140 and 187 to adjust the pitch and the yaw of the projector head 150.

The sequence 200 continues with choosing a desired construction plan, for example a floor plan, at operation 220. The operator picks the floor plan to project upon through the HMI 190. One or more floor plans have been uploaded onto a memory device of the projection device 100 prior to use, either through a USB key or wireless communication such as WiFi, 4G, etc.

The sequence 200 continues at operation 230 with measuring reference points present in the construction site. The operator may cause the projection device 100 to automatically find and measure the reference points to locate itself in space within the construction site, calculating its position and orientation. Alternatively, the operator may use the HMI 190 to manipulate the projection device 100 to locate itself within the construction site. In any case, the projection device 100 may forward the resulting position and orientation to the HMI 190 for display on the GUI.

In one embodiment, the projection device 100 may be operated in a fixed position and orientation. In another embodiment, the projection device 100 may be configured to change its orientation to successively project distinct parts of the construction plan on distinct areas of the construction site. The sequence 200 may thus continue with manually controlling an orientation of the projection device 100 at operation 242, for example by using a joystick or a directional pad part of the HMI 190. Alternatively, one or both of the cameras 172 may automatically track a changing position of a reference device worn by the operator at operation 244 and the projection device 100 may orient itself accordingly. For manual control of the projection device 100 at operation 242, the operator may have the option to turn all windings off on the motor 140 (FIG. 4) and before manipulating the projection device 100 to the desired orientation. It is contemplated that the device could have a scope aligned with its optical path (the optical path of the projection and of the rangefinder 158) that the operator may use to precisely take measurements, much like a total station instrument used by surveyors. In an embodiment the operator select one of two available control modes. The operator may control the projection device 100 to remain in a fixed orientation until a command is received from the HMI 190. The operator may alternatively configure the projection device 100 to continuously track the changing position of the reference object worn by the operator. In the latter case, as the angular position of the operator changes on the construction site, the projection device 100 adjusts its projection to match the part of the floor plan to be projected accordingly.

The sequence 200 continues with starting the projection at operation 250. The projection device 100 having located itself on the construction site, it projects all or part of the chosen floor plan, depending on the spatial position and angular position of the projection device 100 on the construction site and depending on the plan to be projected. The operator may interact with the HMI 190 to start or stop projection by the projection device 100. The operator is able to interact with and change the floor plan through the HMI 190. In particular, the operator may translate, rotate, resize, add or delete entities. This may especially be useful when the construction plans and the as-built environment on the construction site differ from one another. The changes made to the floor plan may be saved into a new floor plan without affecting the original floor plan. In any case, the changes may immediately be reflected by the laser projection. The HMI 190 may also provide commands to increase or decrease a brightness of the laser projection. It should be noted, however, that commands to increase the brightness of the laser projection may be overridden by safety considerations. A laser safety module 196 (FIG. 10) intended to prevent eye damage that could be caused by the laser projection in various circumstances may be provided in an embodiment. This laser safety module 196 may limit the brightness of the laser projection regardless of commands from the HMI 190. The laser safety module 196 is described in more details below.

Figure 7:
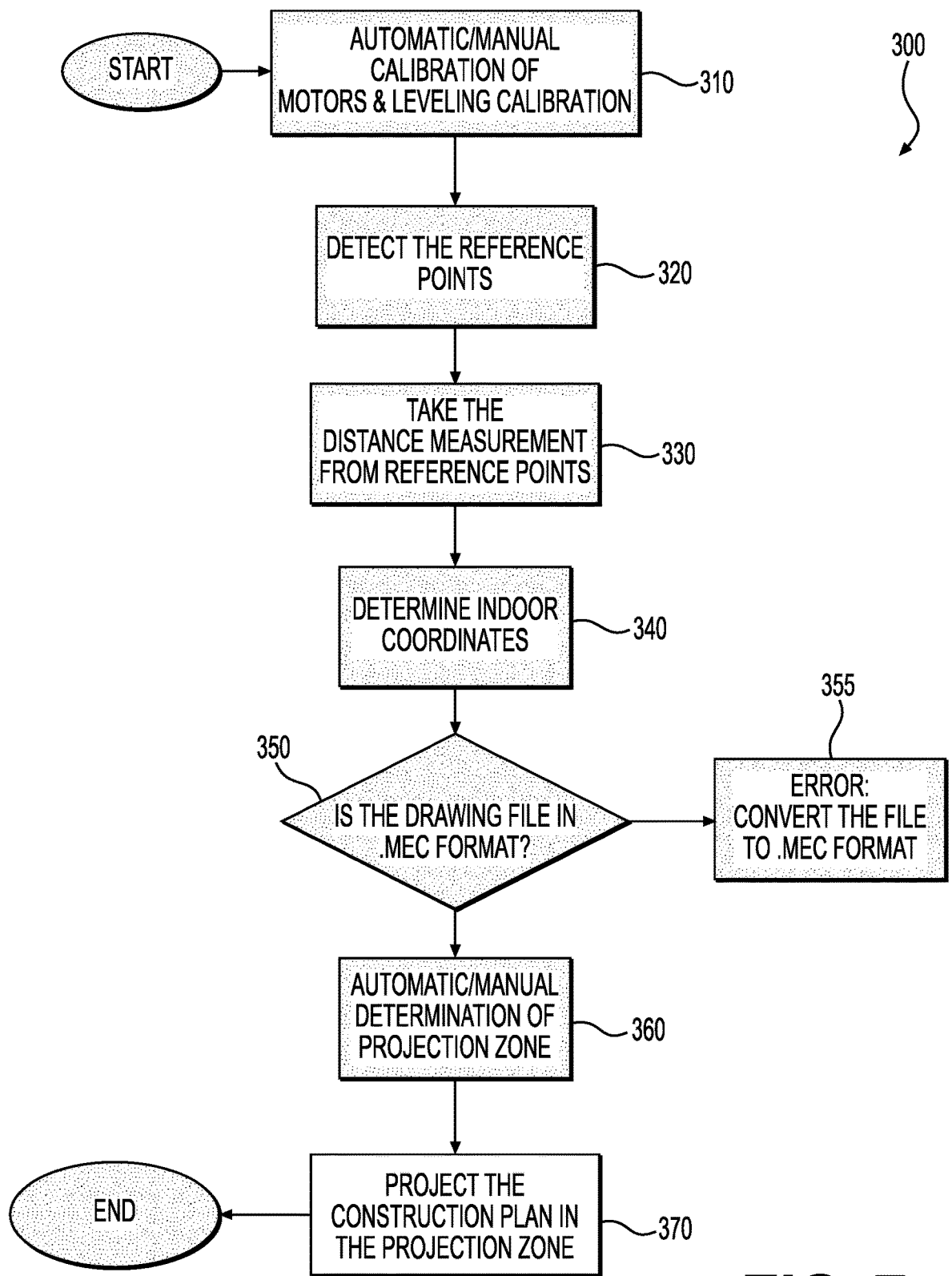
FIG. 7 is a flow chart of a method of operating the projection device of FIG. 1 according to another embodiment of the present technology.

With reference to FIG. 7, a method of operation of the projection device 100 will now be described. On FIG. 7, a sequence 300 comprises a plurality of operations, some of which may be executed in variable order, some of the operations possibly being executed concurrently, some of the operations being optional. The sequence 300 begins with automatic or manual calibration of the motor 140 and leveling of the projection device 100 at operation 310. Leveling of the projection device 100 may comprise adjusting one or both of the pitch and the yaw of the projector 150, for example according to the particularities of the construction site and according to the task at hand. It may be noted that, in this context, the term "leveling" does not necessarily imply placing the projector head 150 in a horizontal orientation. The calibration protocol may be initiated by the operator through the GUI on the HMI 190. According to the calibration protocol, the projection device 100 follows a set of instruction to ensure all its components are correctly calibrated. This may include, without limitation, the use of stepper motors, of a set of cameras, of a rangefinder and of a leveling tool.

The sequence 300 continues with detecting reference points on the construction site at operation 320, and taking distance measurements of the projection device 100 from the reference points at operation 330. The sequence 300 then continues with determining coordinates of the projection device 100 at operation 340.

The operator may use the GUI on the HMI 190 to cause the projection device 100 to automatically locate itself on the construction site. Alternatively, the positioning process of the projection device 100 may be performed manually. When done automatically, the projection device 100 searches known reference points present on the construction site with the help of computer vision or other technologies. The projection device 100 uses the rangefinder 158 to measure its distance to the reference points in view of determining its position relatively to those points, using for example trilateration or other mathematical calculations.

The projection device 100 may integrate other technologies to measure its distance to the reference points. For example, an embodiment of the projection device 100 may use a 3D cloud of points generated by the above-mentioned LiDAR sensor. In this embodiment, the LiDAR sweeps an area of the construction site to generate the 3D cloud of points. The SoC 116 manipulates and transforms the content of the 3D cloud of points to generate an outline of the construction site. The outline is then transformed by the SoC 116 into vectors and coordinates that are compared mathematically with the construction plan to determine the position of the projection device 100. This embodiment may further use information entered on the HMI 190 by the operator pointing on an area of the construction plan to define on a broad level the position of the projection device.

The sequence 300 may then continue with determining if the construction drawings file is in the proper format at operation 350. In an embodiment, before projecting the construction plans, the projection device 100 may read the file format and determine whether it is in the proprietary format (such as a .mec or .msys file). In this embodiment, the projection device 100 may display an error message on the GUI on the HMI 190 at operation 355, if the file is not in the proprietary format. It is contemplated that the sequence 300 may terminate after operation 355. It is also contemplated that, alternatively, the sequence 300 may continue at operation 360, after operation 355. It is further contemplated that operations 350 and 355 may be omitted in an embodiment.

The sequence 300 then continues at operation 360 with adapting a projection of the construction site by determining a projection zone and projecting the construction plan in the determined projection zone at operation 370. Depending on the position and orientation of the projection device 100, the complete construction plan or a part thereof may be projected. In the course of operations 360 and 370, the projection device 100 may stay in a fixed orientation and continuously project the construction plans in its initial orientation. The projector head 150 may be moved while the construction plan is being projected. These movements may be performed manually by the operator or through commands from the HMI 190 to alter the pitch and/or the yaw of the projector head 150. A pitch encoder 406 and a yaw encoder 410 (FIG. 8) may provide real-time measurements of the orientation of the projector head 150 to the SoC 116. Alternatively or in addition, the projection device 100 may continuously track and follow the changing position of the reference device worn by the operator (in some cases, a site foreman) and modify the orientation of the projector head 150 accordingly. Stereo vision from the two cameras 172 or other tracking techniques may detect the movements of the reference device worn by the operator. In any case, the projection device 100 may dynamically and in real-time adjust the projection according to the construction plan, the construction site, and the changing orientation of the projection head 150. In an embodiment, the projection device 100 may refrain from adjusting the projection for small movements of the reference device or for small movements of the projection device.

Various embodiments of the projection device for displaying construction plans and of its operating methods, as disclosed herein, may be envisioned. Such embodiment may comprise variants of the projection device having a casing 400 shown on FIG. 8 or a casing 500 shown on FIG. 9.

Figure 8:
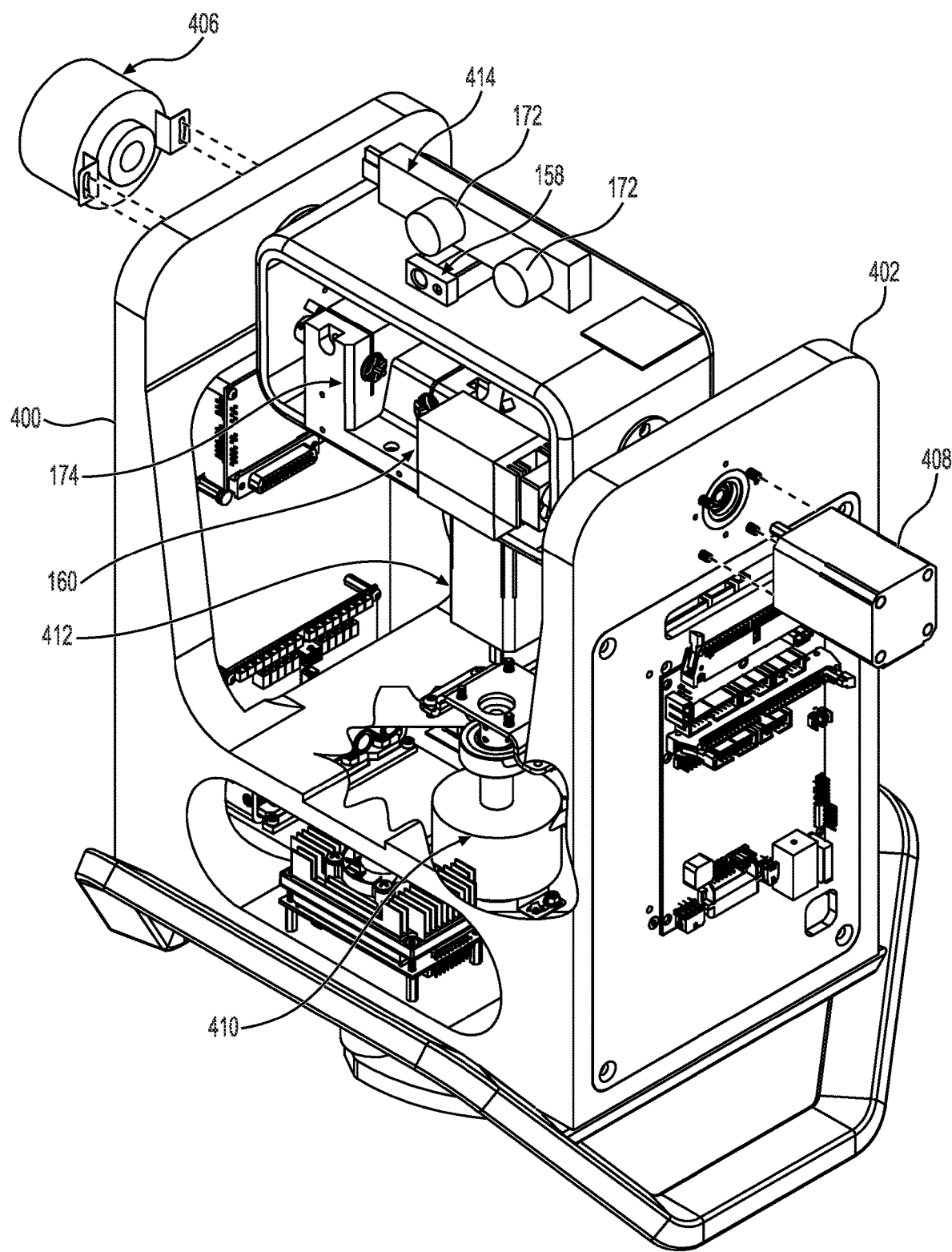
FIG. 8 is a perspective view of a variant of a casing supporting a projector head according to another embodiment of the present technology.

As shown on FIG. 8, the casing 400 supports the laser module 160. A leveling system supporting the laser module 160 comprises a pitch encoder 406, a pitch motor 408, a yaw encoder 410, and a yaw motor 412. A pitch of the projector head 150 may be adjusted under control of the SoC 116 receiving real-time signals from the pitch encoder 406 and providing control signals to the pitch motor 408. A yaw of the projector head 150 may be adjusted under control of the SoC 116 receiving real-time signals from the yaw encoder 410 and providing control signals to the yaw motor 412. Without limitation, the pitch motor 408 and the yaw motor 412 may be stepper motors. As the pitch and the yaw of the projector head 150 are adjusted, the light directed by the mirror galvanometers 174 is directed toward a selected zone within the construction area. In an embodiment, the pitch and the yaw of the projector head 150 may be continuously adjusted. The cameras 172 and the rangefinder 158 are mounted on a camera module 414 that is itself mounted on the laser module 160 so that the cameras 172 and the rangefinder 158 directly track the orientation of the mirror galvanometers 174. The cameras 172 may be able to track the reference device at a distance of 50 meters or more. The cameras 172 may include motorized lenses for automatic focus on long distance targets, for example up to 150 meters away. In an embodiment, the projection device 100 may redirect images captured by the cameras 172 for display on the HMI 190.

Figure 9:
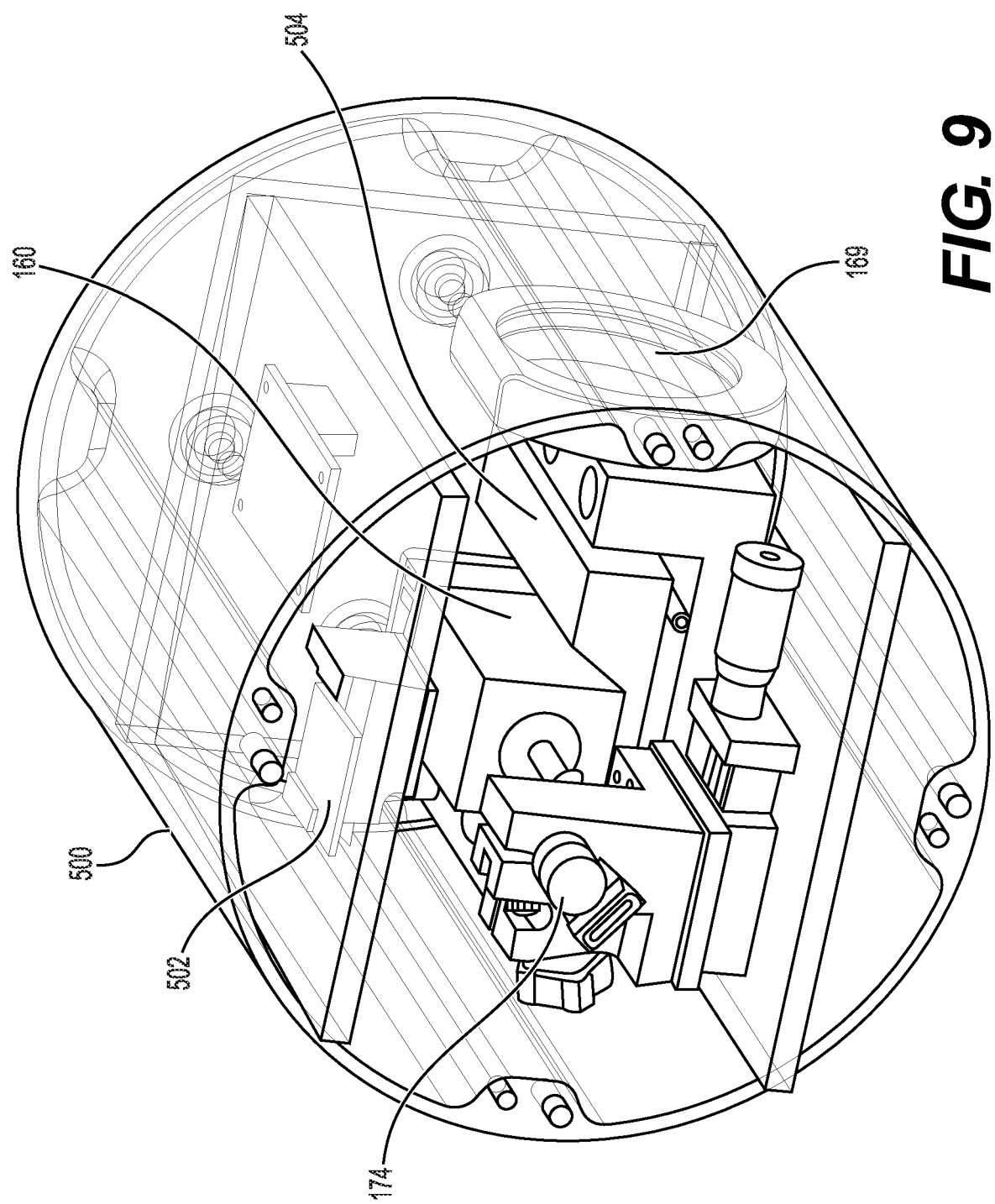
FIG. 9 is perspective view of another variant of a casing supporting a projector head according to another embodiment of the present technology.

A shown on FIG. 9, the casing 500 is another variant that supports similar components as those introduced earlier in the present disclosure. The casing 500 comprises a support 502 mounted on the laser module 160 and supporting the rangefinder 158 and the cameras 172. The casing 500 also supports a laser alignment apparatus 504 controlled by the SoC 116 and operative to adjust at least a pitch of the laser module 160 and of the support 502.

Figure 10:
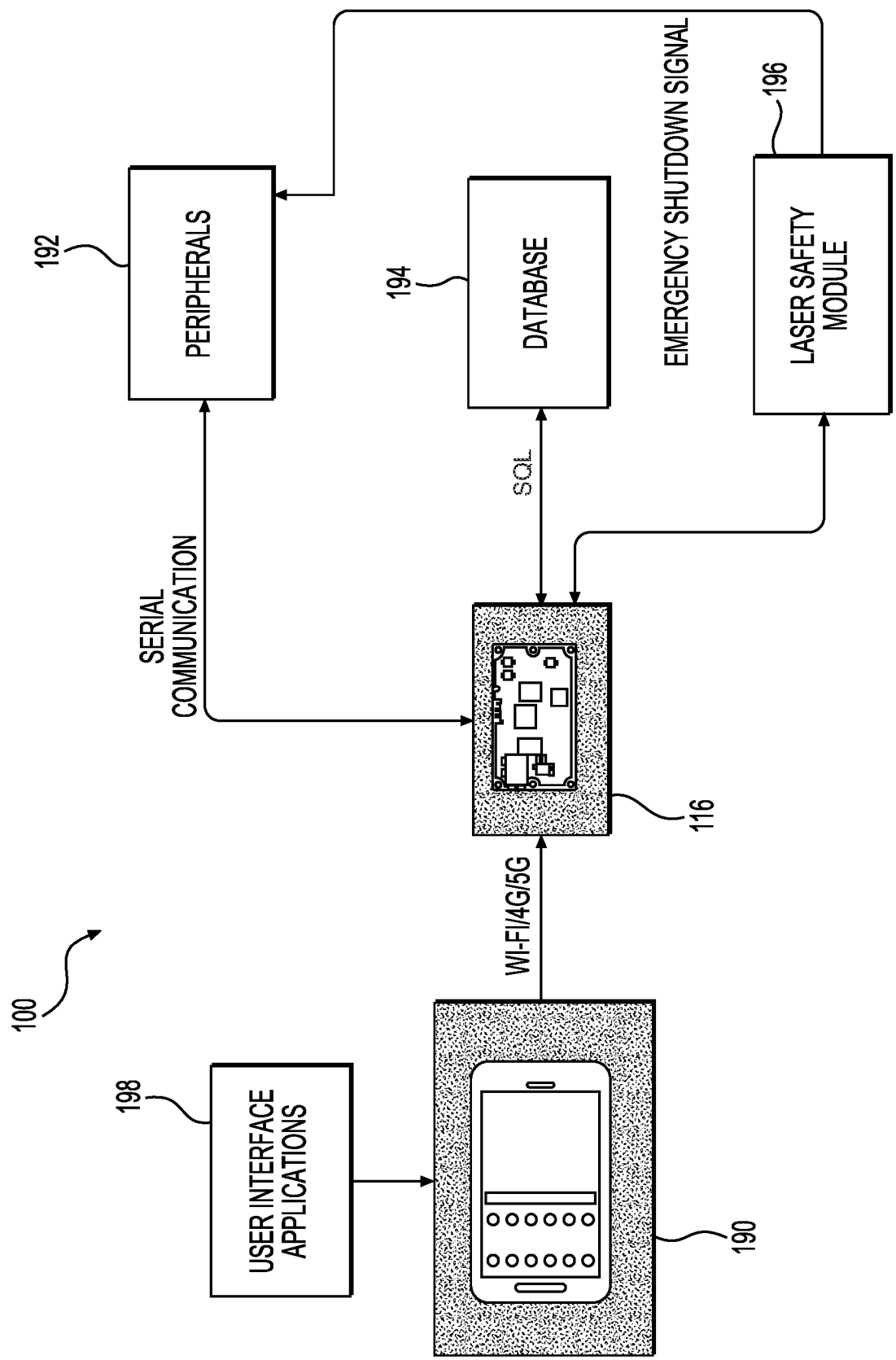
FIG. 10 is a block diagram of the projection device and its environment according to another embodiment of the present technology.

FIG. 10 is a block diagram of the projection device and its environment according to another embodiment of the present technology. In the shown embodiment, the SoC 116 is a central part of the projection device 100. It is connected to the HMI 190, for example via wireless communication using a WiFi, 4G or 5G protocol, to peripherals 192 via a serial communication protocol, to a database 194 and to the laser safety module 196.

The peripherals 192 may include the motors 140 and 187, the laser module 160, the galvanometric mirrors 174, the rangefinder 158 and the cameras 172.

SoC 192 may use a structured query language (SQL) protocol to obtain construction plans from the database 194, to verify customer accounts stored in the database 194, and to cause the database 194 to store logs of changes brought to the construction plans while using the projection device 100.

The HMI 190 may be connected to a user interface applications entity 198 that defines parameters for the display of construction plans, interactions of the operator with the displayed construction plans, and generally for control of the projection device 100.

Figure 11:
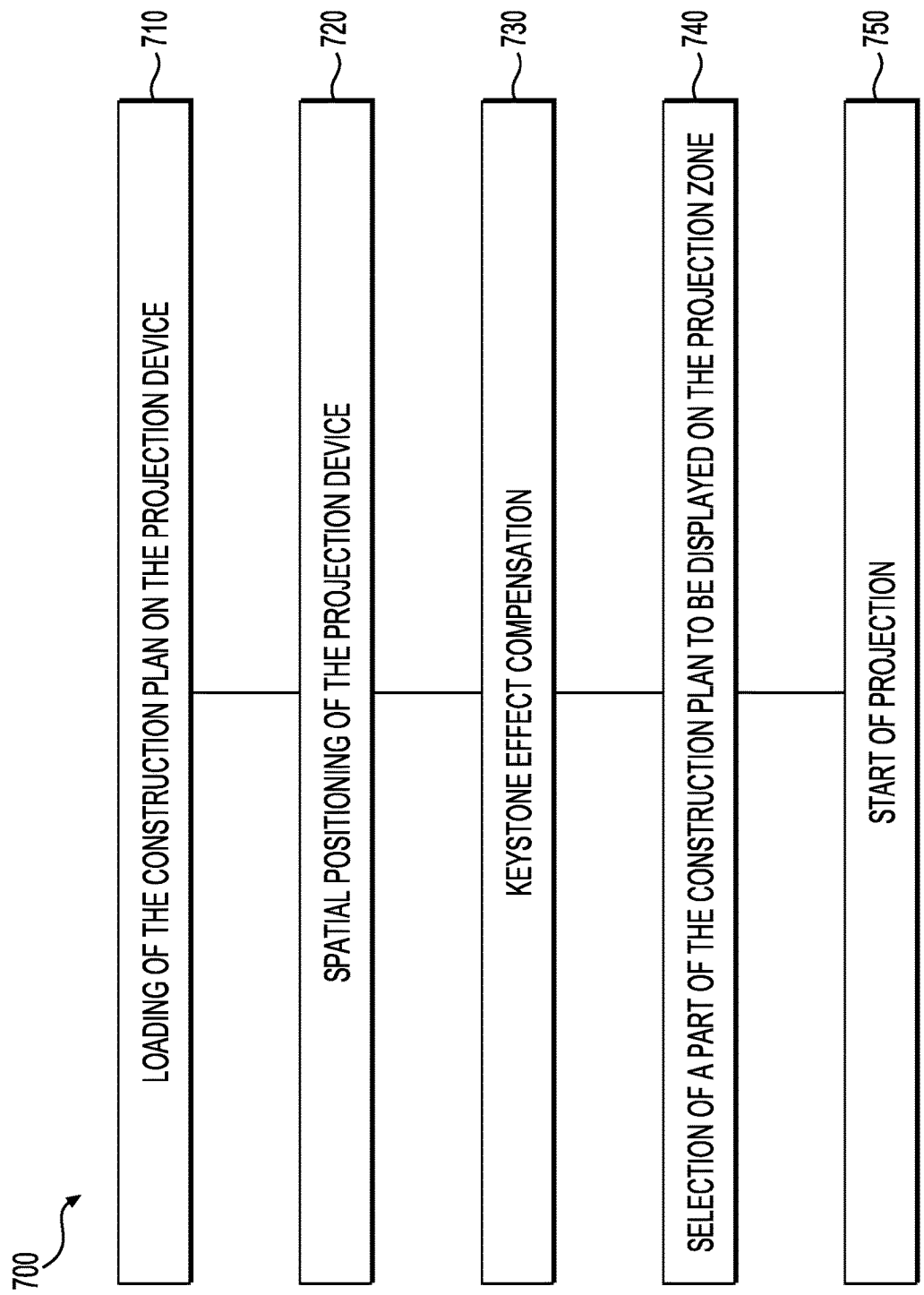
FIG. 11 is a flowchart showing operations of a dynamic laser projection according to an embodiment of the present technology.

FIG. 11 is a flowchart showing operations of a dynamic laser projection according to an embodiment of the present technology. On FIG. 11, a sequence 700 comprises a plurality of operations, some of which may be executed in variable order, some of the operations possibly being executed concurrently, some of the operations being optional. The sequence 700 begins with loading of a construction plan of interest on the projection device 100 at operation 710. The construction plan, which may be in a proprietary format (.msys or .mec), is queried from database 194 and stored in the memory device of the projection device 100.

Spatial positioning information of the projection device 100 is determined at operation 720. This operation 720 allows determining relative locations of three (or more) reference points and of the projection device 100 on the construction site based on measurements of distances between the projection device 100 and the reference points. In an embodiment, trilateration is used in operation 720. In more details, distance measurements are taken by the rangefinder 158 for three or more reference points. For each distance measurement, an angular position is read from the pitch axis encoder 406. The measured distances are mathematically projected to ground level to determine two-dimensional (2D) distances between the projection device 100 and the reference points. The three (or more) 2D distance values are used to calculate a position of the projection device 100 along two horizontal axes (X, Y). The position of the projection device 100 may further be evaluated along a third vertical axis (Z) if one or more of the reference points is not on ground level. It is contemplated that, instead of trilateration based on distance measurements taken by the rangefinder 158, the 3D cloud of points generated by the LiDAR may be used by the SoC 116 to determine the spatial positioning of the projection device 100.

A potential keystone effect may be compensated at operation 730. To this end, current pitch and yaw angular positions of the projector head 150 may be read in real-time from the pitch axis encoder 406 and from the yaw axis encoder 410 by the SoC 116. The SoC 116 may then use the pitch and yaw angular positions of the projector head 150 to generate equivalent vector sets that are modified from the vector sets originally calculated based on the construction plan. The equivalent vector sets are used to compensate the projection of the construction plan for the potential keystone effect.

Operation 740 may comprise a selection of a part of the construction plan to be displayed on a projection zone of the construction site. Boundaries of a field of view of the projection device 100 are evaluated by the SoC 116 based at least in part on the position of the reference points to define a projection zone. The SoC 116 determines lines of the construction plan that intersect with these boundaries. The construction plan is clipped by removing elements of the construction plan that would be positioned outside of the projection zone. The SoC 116 then controls the laser module 160 and the mirror galvanometers 174 to display unclipped parts of the construction plan within the projection zone. It is understood that, in some situations, the complete construction plan may be displayed at once, particularly when the construction plan does not contain elements beyond the field of view of the projection device.

Projection of the construction plan on the construction site on the construction site, or projection of a part of the construction plan when the construction plan is clipped to fit within the field of view of the projection device 100, is started at operation 750. The SoC 116 concurrently generates control signals defined based on the vector sets and communicated to the galvo driver 182 for the galvanometric mirrors 174 and other control signals communicated to the laser module 160. These control signals may be converted from a digital format emitted by the SoC 116 to an analog format, as will be shown in the description of FIG. 12. In an embodiment, the SoC 116 may recalculate vector sets and generate hundreds of such signals for each degree of rotation of the mirror galvanometers 174.

The projection device 100 may optionally be used on a construction site where no reference point is available. In an embodiment, positioning information for the projection device 100 may be manually entered by the operator using the HMI 190. Alternatively, if the position of the projection device 100 cannot be obtained, the operator may cause the projection device to execute at least operations 720 and 750 so that the construction plan is projected on the construction site, this projection being quite inaccurate in most circumstances. The operator may then move the projection device 100 to illuminate a desired area of the construction site, use the HMI 190 to select a part of the construction plan that matches the area of the construction site that is illuminated by the projection device 100, translate, rotate and/or scale the projected image to fit with the projection area, adjust a focus of the projection. Once these adjustments are made to the satisfaction of the operator, the HMI 190 may provide to the projection device 100 a command to store the current settings in the memory device.

FIG. 12 is a logical view of a hardware architecture of the projection device according to another embodiment of the present technology. In this embodiment, the SoC 116 is complemented by another microcontroller 420, for example and without limitation an Arduino Due, and by a specialized controller card 430, for example and without limitation a ScanMaster controller from Cambridge Technology. The microcontroller 420 and the specialized controller card 430 are mainly used to offload some processing from the SoC 116 and may be omitted in some implementations.

The microcontroller 420 acts as an interface for exchanging in real-time digital signals between the SoC 116 and the pitch axis encoder 406, a stepper motor driver 422 controlling the pitch axis motor 408, the yaw axis encoder 410 and a stepper motor driver 424 controlling the yaw axis motor 412. The specialized controller card 430 is connected to a TCP/IP socket of the SoC 116 and translates control signals of the SoC 116 for the laser module 160 into analog control signals applied to the laser module 160. The specialized controller card 430 also forwards digital control signals of the SoC 116 intended to control the mirror galvanometers 174 to a high precision digital to analog convertor (DAC) 432, for example a 16-bit DAC. The DAC 432 translates these control signals into analog signals having an equivalent 16-bit precision. The analog signals are applied to the galvo driver 182 that actuates the mirror galvanometers 174. In an embodiment, the shown galvo driver 182 may be substituted with another galvo driver capable of receiving control signals in digital format, for example a XY2-100 from Newson Engineering. The DAC 432 may be omitted in this embodiment.

A communication module 440 embedded in the projection device 100 and communicatively coupled to the SoC 116 allows the SoC 116 to communicate wirelessly, using a 4G or a 5G connection, with an external database 442 implemented on a web site. The SoC 116 may query the database 442 to obtain software upgrades for operation of the projection device 100, access construction plans and client accounts, and the like. Communication of the SoC 116 with the HMI 190 may take place over a WiFi connection, using a REST application programming interface (API). Use of other communication protocols, for example Bluetooth, or use of wired connections, is also contemplated.

The laser safety module 196 may be provided for the eye safety of the personnel on the construction site. The laser safety module 196 is connected to and is adapted to dynamically control operations of the laser module 160. For example, the laser safety module 196 may interrupt the laser module 160 when the presence of a person near the projection device 100 is detected or when a fault is detected in the projection device 100. The laser safety module 196 may also dynamically attenuate an intensity of the laser module 160 to maintain a brightness of the projected construction plan within a safe level.

In more details, the laser safety module 196 includes a real-time monitoring function of a signal provided by a proximity detector when detecting persons located in the optical path of the projection device 100 and at a close distance from the projection device 100. The laser safety module 196 implements an emergency laser shutdown function that interrupts the operation of the laser module 160 when the signal from the proximity detector is interpreted as a safety hazard for that person. One of the cameras 172 may act as the proximity detector and provide images that are used to detect the presence of a person near the projection device 100. In an embodiment, the laser safety module 196 may be directly connected to the laser module 160 so that laser emission may be interrupted rapidly, without the need for intervention by the SoC 116. In an embodiment, the signal from the proximity detector may indicate a distance between the person and the projection device 100 and the laser safety module 196 may consider a power level of the laser module 160 and the distance between the person and the projection device 100 to determine whether there is a safety hazard for that person. Control of the laser module 160 when the proximity detector detects the presence of a person close to the projection device 100 but outside of the optical path of the projection device 100, for example when a person is standing behind the projection device 100, is also contemplated.

The laser safety module 196 may also receive a fault indication from various components of the projection device. As an example, the fault indication may be received from the galvo driver 182 when the mirror galvanometers 174 have stopped their normal operation, causing the projection device 100 to direct the laser beam to a single point according to a fixed position of the mirror galvanometers. Other fault indications may be received from the SoC 116 and relate, for example, to a breakage of the casing 110 or of the projection optics 166 that may cause the laser beam to leak in various directions. Another example of a fault indication may relate to a software fault in the SoC 116 or to a communication error between the SoC 116 and other components of the projection device 100. The laser safety module 196 may interrupt the operation of the laser module 160 in response to any fault indication.

The laser safety module 196 is configured to evaluate a risk of eye damage caused by the light emitted by the projection device 100 to any person on the construction site. This risk is evaluated in view of a brightness of the projection of the construction plan and in view of a safety threshold based on scientific data related to safe levels of retinal exposure to laser light sources. The brightness of the projection of the construction plan is calculated based on a power intensity (in mW) of the laser module 160, in view of a size of the aperture 169, in view of a type of the laser including its wavelength. The laser safety module 196 may further estimate the brightness of the projection on the construction site by considering one or more of a number of lines on the projection of the construction plan, a length of the lines, a combined length of the lines, intersections between the lines, an environmental luminosity, and a number of jumps in the projection of the construction plan. These parameters allow the laser safety module 196 to evaluate a brightness of the laser projection in any given section of the projected construction plan. Information about a maximum power level and other characteristics of the laser module 160 may be stored in the memory device connected to the SoC 116. Storing in the memory device a reference table based on the scientific data related to safe levels of retinal exposure to laser light sources is also contemplated. This information stored in the memory device may be preloaded in the laser safety module 196 when the projection device 100 is initially powered on. The laser safety module 196 dynamically controls the laser module 160 by attenuating its intensity until the brightness of the projection of the construction plan is less than the safe level of retinal exposure. In an embodiment, the laser safety module 196 controls the brightness of each line on the projection of the construction plan to dynamically maintain a brightness density of the projection in any given section of the projected construction plan below the safe level of retinal exposure.

Referring again to FIG. 10, a feedback loop may be implemented between the laser safety module, the SoC 116, and peripherals 192 containing the laser module 160 so that the emitted intensity of the laser beam is maintained at a safe level in any region of the projected construction plan.

Embodiments of the projection device 100 are made to be compliant with relevant standards and operation criteria. In particular, the projection device 100 is adapted to withstand environmental hazards of the construction site, including accidental impacts, occasional rain, prolonged used in hot or freezing temperatures, and prolonged exposition to the sun. For example, the projection device 100 may be impact resistant, waterproof, dustproof and/or water resistant. In particular, the projection device 100 may comply with the IP55 specification of the National Electrical Manufacturers Association (NEMA) and/or meet the IK08 rating defined in the European standard EN 62262. The projection device 100 may further comply with various Design for Manufacturing and Assembly (DFMA) guidelines.

Figure 13:
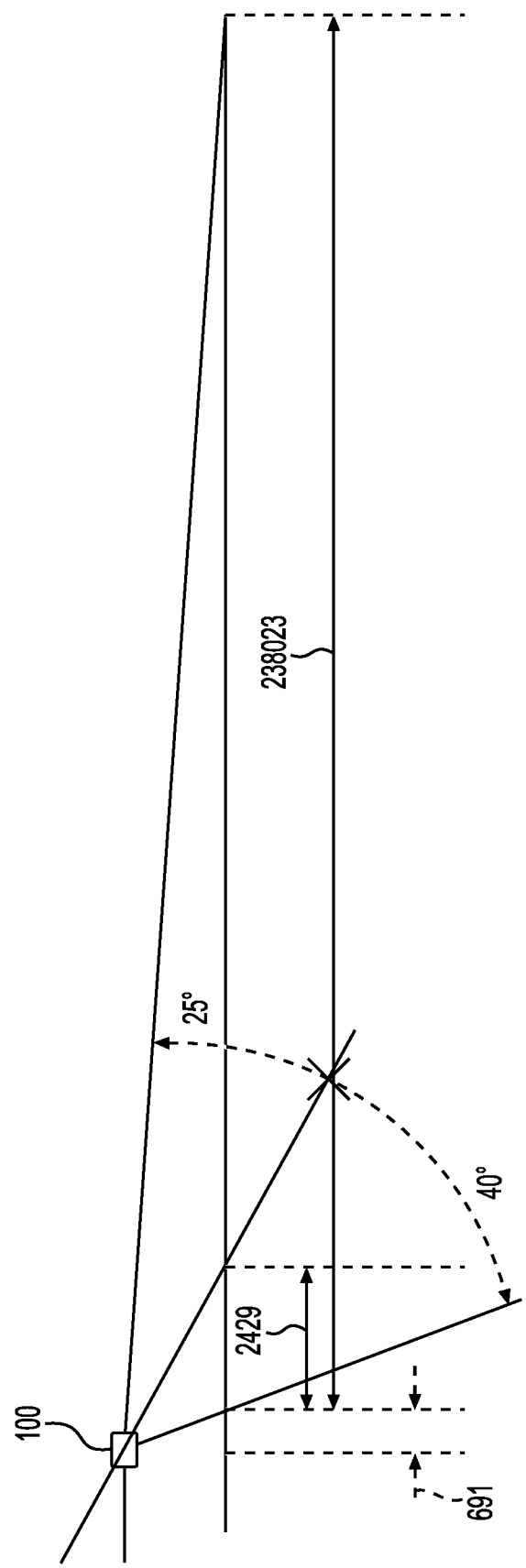
FIG. 13 is a side view of a laser projection size obtained using the projection device.
Figure 14:
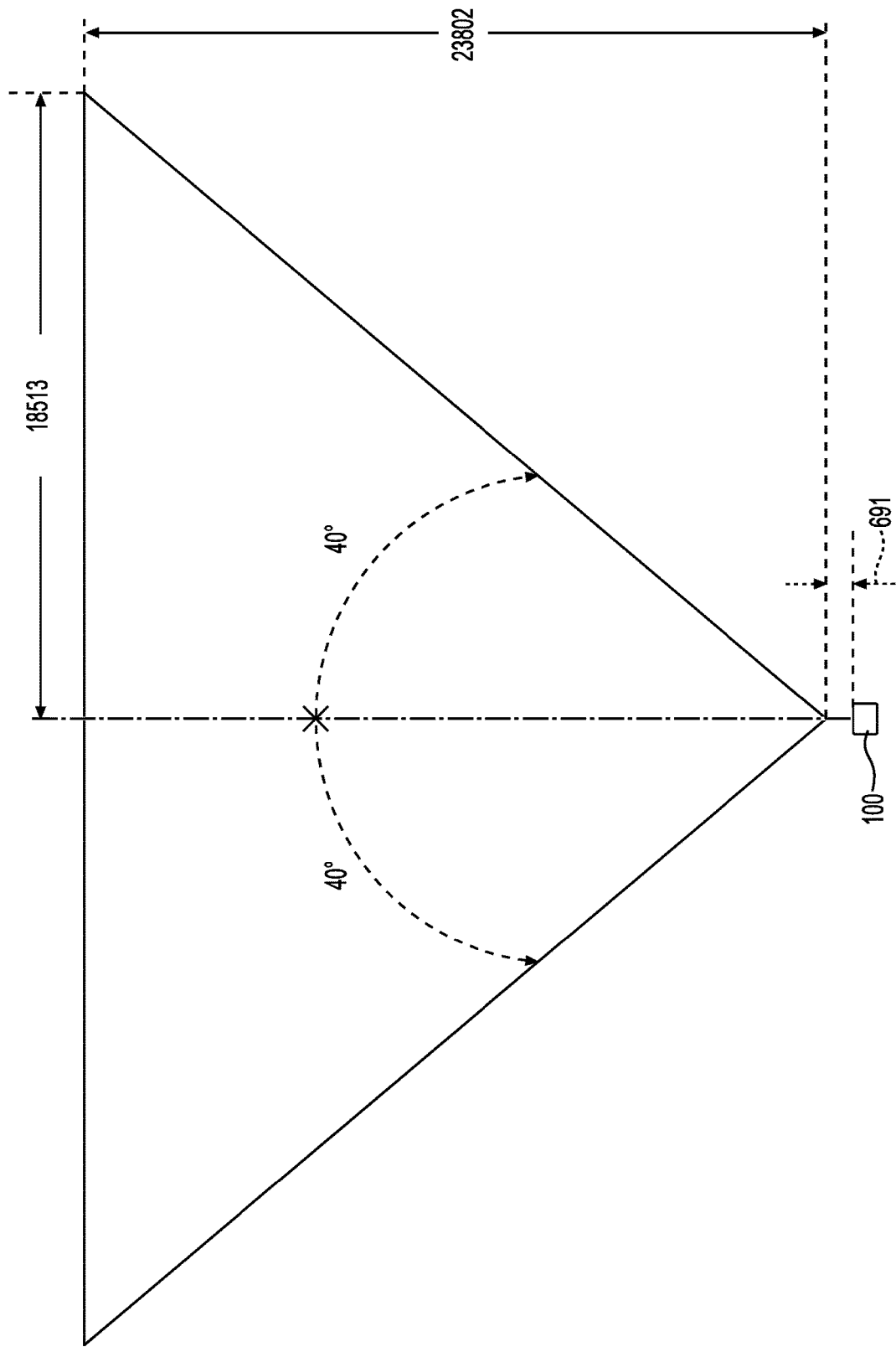
FIG. 14 is a top view of the laser projection size obtained using the projection device.

FIGS. 13 and 14 respectively show a side view and a top view of a laser projection size obtained using the projection device 100. Numerical values shown on FIGS. 13 and 14 are typical and do not limit the present disclosure. Dimensions are in mm, except for angles that are in degrees.

In a typical use case, the projection module 100 is mounted on its tripod 102 and stands at 1700 mm above floor level, this height and the position of the projection module 100 on the floor defining an original of projection reference point. A pitch angle of the projector head 150 is set to 29 degrees below horizontal because it is desired to project the construction plan on the floor. The mirror galvanometers 174 have 80 degrees of optical range both in the horizontal and in the vertical direction. On FIG. 14, this range is split into 40 degrees left and right of a direct line from the projection module 100 and defines a projection zone. Given the pitch angle of the projector head 150, a maximum depth of the projection zone is about 23.8 meters and a width of the projection zone at the maximum depth is about 18.5 meters on each side of the direct lien from the projection module 100. On FIG. 13, a laser dot emitted by the projection device 100 when the mirror galvanometers 174 are both in their center position is placed at about 2.43 meters from the projection device 100. When the mirror galvanometers 174 are oriented at their lowest angle, 40 degrees below the pitch angle of the projector head 150, the laser light comes as close as 691 mm from the projection device 100. A dead zone having a depth of 691 mm is thus defined from the position of the projection device 100. Although the mirror galvanometers 174 can be oriented at 40 degrees above the pitch angle of the projector head 150, excessively raising the angle of the mirror galvanometers 174 would lead to the projection device 100 emitting its laser beam horizontally, to an infinite distance. In practice, the mirror galvanometers 174 may be controller to rise up to 25 degrees above center, the aim of the laser beam being at 4 degrees below horizontal when factoring the pitch angle of the projector head 150. Rising up the mirror galvanometers 174 to 25 degrees allows the laser beam to reach a point on the floor at about 23.8 meters (as shown on FIG. 14).

Although the projection device 100 may be able to project construction plans over the projection zone illustrated as a triangle on FIG. 14, the projection device 100 may be operated to limit the projection zone to a smaller size within which accuracy of the projection is more easily controlled.

Those of ordinary skill in the art will realize that the description of the projection device for displaying construction plans and of its operating methods are illustrative only and are not intended to be in any way limiting. Other embodiments will readily suggest themselves to such persons with ordinary skill in the art having the benefit of the present disclosure. Furthermore, the disclosed projection device and operating method may be customized to offer valuable solutions to existing needs and problems related to inaccuracies, wasted time and wasted efforts on construction sites. In the interest of clarity, not all of the routine features of the implementations of the projection device and operating method are shown and described. In particular, combinations of features are not limited to those presented in the foregoing description as combinations of elements listed in the appended claims form an integral part of the present disclosure. It will, of course, be appreciated that in the development of any such actual implementation of the projection device and operating method, numerous implementation-specific decisions may need to be made in order to achieve the developer's specific goals, such as compliance with application-related, system-related, network-related, and business-related constraints, and that these specific goals will vary from one implementation to another and from one developer to another. Moreover, it will be appreciated that a development effort might be complex and time-consuming, but would nevertheless be a routine undertaking of engineering for those of ordinary skill in the field of projection devices having the benefit of the present disclosure.

In accordance with the present disclosure, the components, process operations, and/or data structures described herein may be implemented using various types of operating systems, computing platforms, network devices, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used. Where a method comprising a series of operations is implemented by a computer, a processor operatively connected to a memory device, or a machine, those operations may be stored as a series of instructions readable by the machine, processor or computer, and may be stored on a non-transitory, tangible medium.

Systems and modules described herein may comprise software, firmware, hardware, or any combination(s) of software, firmware, or hardware suitable for the purposes described herein. Software and other modules may be executed by a processor and reside on a memory device of servers, workstations, personal computers, computerized tablets, personal digital assistants (PDA), and other devices suitable for the purposes described herein. Software and other modules may be accessible via local memory device, via a network, via a browser or other application or via other means suitable for the purposes described herein. Data structures described herein may comprise computer files, variables, programming arrays, programming structures, or any electronic information storage schemes or methods, or any combinations thereof, suitable for the purposes described herein.

The present disclosure has been described in the foregoing specification by means of non-restrictive illustrative embodiments provided as examples. These illustrative embodiments may be modified at will. The scope of the claims should not be limited by the embodiments set forth in the examples, but should be given the broadest interpretation consistent with the description as a whole.

What is claimed is:

1. A projection device for displaying construction plans, the projection device comprising:
   a projector head comprising:
      a set of projection optics,
      a laser module, and
      two mirror galvanometers, including a first mirror galvanometer configured to redirect incident light from the laser module toward a second mirror galvanometer, the second mirror galvanometer being configured to redirect the incident light from the first mirror galvanometer toward the set of projection optics;
   a laser safety module operatively connected to the laser module;
   a memory device adapted for storing one or more construction plans; and
   a controller operatively connected to the laser module, the two mirror galvanometers, the laser safety module, and the memory device, the controller being adapted for:
      choosing a construction plan to be displayed from the memory device,
      selectively activating the laser module, and
      selectively causing the first and second mirror galvanometers to follow a path defined by the chosen construction plan concurrently with the selective activation of the laser module so that the incident light redirected toward the projection optics selectively forms a projection of the construction plan on a construction site;
   wherein the laser safety module is configured to:
      calculate a safe level of retinal exposure to laser light,
      estimate a brightness of the projection of the construction plan by considering one or more of a number of lines on the projection of the construction plan, a length of the lines, a combined length of the lines, intersections between the lines, and a number of jumps in the projection of the construction plan, and
      dynamically control an operation of the laser module by attenuating its intensity until the brightness of the projection of the construction plan is less than the safe level of retinal exposure.

2. The projection device of claim 1, further comprising:
   a first camera operatively connected to the controller and adapted to track a changing position of a moving reference point;
   wherein the controller is further configured to adapt the projection of the chosen construction plan in view of the changing position of the moving reference point.

3. The projection device of claim 1, further comprising:
   a LiDAR sensor configured to scan the construction site to generate a 3D cloud of points representing the construction site;
   wherein the controller is further configured to calculate at least one of a flatness and an elevation of one or more surfaces of the construction site based on the 3D cloud of points provided by the LiDAR sensor.

4. The projection device of claim 1, wherein the controller is further configured to adapt the projection of the chosen construction plan in view of a change of a pitch or a yaw or both the pitch and the yaw of the projector head.

5. The projection device of claim 1, further comprising:
a pitch encoder adapted to measure a pitch of the projector head;
a yaw encoder adapted to measure a yaw of the projector head; and
wherein the controller is further configured to adapt the projection of the chosen construction plan in view of a change of the pitch, the yaw or both the pitch and the yaw of the projector head.

6. The projection device of claim 1, wherein the laser safety module is adapted to receive a fault indication from a component of the projection device and cause an interruption of the laser module in response to the fault indication.

7. The projection device of claim 6, wherein the fault indication relates to a fault of one or both of the mirror galvanometers.

8. The projection device of claim 6, wherein the fault indication relates to a software fault or a communication fault reported by the controller.

9. The projection device of claim 1, further comprising a proximity sensor operatively connected to the laser safety module, the laser safety module being configured to:
receive, from the proximity sensor, a signal indicating a presence of a person in close proximity to the projection device, and
cause an interruption of the laser module when the laser safety module interprets the signal indicating the presence of the person in close proximity to the projection device as a safety hazard for that person.

10. The projection device of claim 1, further comprising:
a rangefinder operatively connected to the controller and adapted to measure distances between the projection device and reference points positioned on the construction site;
wherein the controller is further configured to:
receive the measured distances between the projection device and the reference points, and
calculating a position and an orientation of the projection device within the construction site based on the measured distances between the projection device and the reference points.

11. The projection device of claim 10, wherein the controller is further configured to adapt the projection of the chosen construction plan to a projection zone determined in view of the position and of the orientation of the projection device within the construction site.

12. The projection device of claim 1, wherein the laser safety module controls the brightness of each line on the projection of the construction plan to dynamically maintain a brightness density of the projection in any given section of the projected construction plan below the safe level of retinal exposure.

13. A method of operation of the projection device as defined in claim 1, the method comprising:
loading a construction plan in the projection device;
positioning the projection device on a construction site; and
initiating the projection of the construction plan on the construction site.

14. A projection device for displaying construction plans, the projection device comprising:
a projector head comprising:
a set of projection optics,
a laser module, and
a galvanometric system adapted to direct incident light from the laser module toward the set of projection optics;
a memory device adapted for storing one or more construction plans;
a controller operatively connected to the laser module, the galvanometric system, and the memory device, the controller being adapted for:
choosing a construction plan to be displayed from the memory device,
selectively activating the laser module, and
selectively causing the galvanometric system to follow a path defined by the chosen construction plan concurrently with the selective activation of the laser module so that the incident light redirected toward the projection optics selectively forms a projection of the construction plan on a construction site; and
a laser safety module operatively connected to the laser module, the laser safety module being adapted for:
calculating a safe level of retinal exposure to laser light,
estimating a brightness of the projection of the construction plan by considering one or more of a number of lines on the projection of the construction plan, a length of the lines, a combined length of the lines, intersections between the lines, and a number of jumps in the projection of the construction plan, and
dynamically controlling an operation of the laser module by attenuating its intensity until the brightness of the projection of the construction plan is less than the safe level of retinal exposure.

15. The projection device of claim 14, wherein the laser safety module is adapted to receive a fault indication from a component of the projection device and cause an interruption of the laser module in response to the fault indication.

16. The projection device of claim 14, further comprising a proximity sensor operatively connected to the laser safety module, the laser safety module being configured to:
receive, from the proximity sensor, a signal indicating a presence of a person in close proximity to the projection device, and
cause an interruption of the laser module when the laser safety module interprets the signal indicating the presence of the person in close proximity to the projection device as a safety hazard for that person.

17. A projection device for displaying construction plans, the projection device comprising:
a projector head comprising:
a set of projection optics,
a laser module, and
two mirror galvanometers, including a first mirror galvanometer configured to redirect incident light from the laser module toward a second mirror galvanometer, the second mirror galvanometer being configured to redirect the incident light from the first mirror galvanometer toward the set of projection optics;
a laser safety module operatively connected to the laser module;
a memory device adapted for storing one or more construction plans;
a first camera operatively connected to the controller and adapted to track a changing position of a moving reference point;

a second camera operatively connected to the controller; and
a controller operatively connected to the laser module, the two mirror galvanometers, the laser safety module, and the memory device, the controller being adapted for:
choosing a construction plan to be displayed from the memory device,
selectively activating the laser module, and
selectively causing the first and second mirror galvanometers to follow a path defined by the chosen construction plan concurrently with the selective activation of the laser module so that the incident light redirected toward the projection optics selectively forms a projection of the construction plan on a construction site;
wherein the laser safety module is configured to:
calculate a safe level of retinal exposure to laser light,
estimate a brightness of the projection of the construction plan by considering one or more of a number of lines on the projection of the construction plan, a length of the lines, a combined length of the lines, intersections between the lines, an environmental luminosity at the construction site, and a number of jumps in the projection of the construction plan, and
dynamically control an operation of the laser module by attenuating its intensity until the brightness of the projection of the construction plan is less than the safe level of retinal exposure;
the controller being further configured to:
adapt the projection of the chosen construction plan in view of the changing position of the moving reference point,
detect a luminance of the construction site based on images provided by the second camera, and
adjust a power level of the laser module according to the luminance of the construction site.

* * * * *